(12) United States Patent
Weinerth et al.

(10) Patent No.: US 11,093,093 B2
(45) Date of Patent: Aug. 17, 2021

(54) TRANSCAPACITIVE AND ABSOLUTE CAPACITIVE SENSING PROFILES

(71) Applicant: Synaptics Incorporated, San Jose, CA (US)

(72) Inventors: John Weinerth, San Jose, CA (US); David Sobel, San Jose, CA (US); Derek Solven, San Jose, CA (US); Adam Schwartz, San Jose, CA (US); Joseph Kurth Reynolds, San Jose, CA (US); Tracy Scott Dattalo, San Jose, CA (US); David Hoch, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/834,976

(22) Filed: Mar. 30, 2020

(65) Prior Publication Data

US 2020/0233531 A1    Jul. 23, 2020

Related U.S. Application Data

(63) Continuation-in-part of application No. 15/696,004, filed on Sep. 5, 2017, now abandoned, which is a
(Continued)

(51) Int. Cl.
   *G06F 3/044* (2006.01)
   *G01R 27/26* (2006.01)
   *G06F 3/041* (2006.01)

(52) U.S. Cl.
   CPC ...... *G06F 3/0445* (2019.05); *G06F 3/041662* (2019.05); *G01R 27/2605* (2013.01); *G06F 3/0443* (2019.05); *G06F 3/041661* (2019.05)

(58) Field of Classification Search
   CPC .... G06F 3/0445; G06F 3/0442; G06F 3/0446; G06F 3/041662; G06F 3/041661; G01R 27/2605; G05F 3/0443
   See application file for complete search history.

(56) References Cited

U.S. PATENT DOCUMENTS

| 4,016,490 A | 4/1977 | Weckenmann et al. |
| 5,841,078 A | 11/1998 | Miller et al. |
| (Continued) | | |

OTHER PUBLICATIONS

Santaolalla, G., "Key-Reading Circuit Saves I/O PINS", www.edn.com, Mar. 6, 2003, 3 pages.

*Primary Examiner* — Patrick N Edouard
*Assistant Examiner* — Douglas M Wilson
(74) *Attorney, Agent, or Firm* — Ferguson Braswell Fraser Kubasta PC

(57) ABSTRACT

A processing system includes a sensor module configured to receive first and second signals from first and second sensor electrodes, respectively, and generate a combination signal. The processing system further includes a determination module configured to determine, using the first sensor electrode, an absolute capacitive coupling to an input object; determine, using the first and second sensor electrodes, a transcapacitive coupling; determine a ratio of the absolute to transcapacitive coupling; determine, using the combination signal, in absence of a predetermined low ground mass state, and when the ratio fails to exceed a predetermined threshold, first positional information regarding a location of the input object; and determine, when the ratio fails to exceed the predetermined threshold and in presence of the predetermined low ground mass state, second positional information regarding the location of the input object in the sensing region using an absolute capacitive scan.

20 Claims, 21 Drawing Sheets

Related U.S. Application Data continuation-in-part of application No. 14/527,688, filed on Oct. 29, 2014, now Pat. No. 9,753,570.

(60) Provisional application No. 61/953,671, filed on Mar. 14, 2014, provisional application No. 62/535,529, filed on Jul. 21, 2017.

(56) References Cited

U.S. PATENT DOCUMENTS

| | | |
|---|---|---|
| 5,945,980 A | 8/1999 | Moissev et al. |
| 6,642,857 B1 | 11/2003 | Schediwy et al. |
| 7,253,643 B1 | 8/2007 | Seguine |
| 7,256,714 B2 | 8/2007 | Philipp |
| 7,323,885 B2 | 1/2008 | Gutendort |
| 7,521,942 B2 | 4/2009 | Reynolds |
| 7,911,456 B2 | 3/2011 | Gillespie et al. |
| 7,920,129 B2 | 4/2011 | Hotelling et al. |
| 7,990,160 B2 | 8/2011 | Reynolds |
| 8,054,300 B2 | 11/2011 | Bernstein |
| 8,259,076 B2 | 9/2012 | Trent, Jr. et al. |
| 8,462,135 B1 | 6/2013 | Xiao et al. |
| 8,653,834 B2 | 2/2014 | Reynolds |
| 2002/0122131 A1 | 9/2002 | Sergio et al. |
| 2004/0252109 A1 | 12/2004 | Trent et al. |
| 2005/0156881 A1 | 7/2005 | Trent et al. |
| 2005/0162408 A1 | 7/2005 | Martchovsky |
| 2006/0032680 A1 | 2/2006 | Elias et al. |
| 2006/0119369 A1 | 6/2006 | Kawahata et al. |
| 2006/0244733 A1 | 11/2006 | Geaghan |
| 2007/0074913 A1 | 4/2007 | Geaghan et al. |
| 2007/0074914 A1 | 4/2007 | Geaghan et al. |
| 2007/0164756 A1 | 7/2007 | Lee |
| 2007/0247443 A1 | 10/2007 | Philipp |
| 2008/0006454 A1 | 1/2008 | Hotelling |
| 2008/0042661 A1 | 2/2008 | Reynolds |
| 2008/0048997 A1 | 2/2008 | Gillespie et al. |
| 2008/0157782 A1 | 7/2008 | Krah |
| 2008/0158172 A1 | 7/2008 | Hotelling et al. |
| 2008/0158183 A1 | 7/2008 | Hotelling et al. |
| 2008/0162996 A1 | 7/2008 | Krah et al. |
| 2008/0162997 A1 | 7/2008 | Vu et al. |
| 2009/0084611 A1 | 4/2009 | Liao et al. |
| 2009/0284495 A1 | 11/2009 | Geaghan et al. |
| 2010/0001973 A1 | 1/2010 | Hotelling et al. |
| 2010/0060608 A1 | 3/2010 | Yousefpor |
| 2010/0164889 A1 | 7/2010 | Hristov et al. |
| 2010/0245286 A1 | 9/2010 | Parker |
| 2010/0292945 A1 | 11/2010 | Reynolds et al. |
| 2011/0006832 A1 | 1/2011 | Land et al. |
| 2011/0012840 A1* | 1/2011 | Hotelling .............. G06F 3/0418 345/173 |
| 2011/0025629 A1 | 2/2011 | Grivna et al. |
| 2011/0175671 A1 | 7/2011 | Reynolds |
| 2012/0043971 A1 | 2/2012 | Maharyta |
| 2012/0044199 A1 | 2/2012 | Karpin et al. |
| 2012/0081335 A1 | 4/2012 | Land et al. |
| 2012/0154324 A1 | 6/2012 | Wright et al. |
| 2013/0100071 A1 | 4/2013 | Wright et al. |
| 2013/0285973 A1 | 10/2013 | Elias et al. |
| 2015/0049044 A1 | 2/2015 | Yousefpor et al. |
| 2015/0378479 A1 | 12/2015 | Hayashi et al. |
| 2016/0188105 A1* | 6/2016 | Kremin ................. G06F 3/0446 345/174 |
| 2016/0224189 A1* | 8/2016 | Yousefpor ........... G06F 3/04186 |

\* cited by examiner

700

```
DRIVE A MODULATED SIGNAL ONTO A FIRST SENSOR ELECTRODE
OF A SENSOR ELECTRODE PATTERN
701
          ↓
RECEIVE FIRST RESULTING SIGNALS FROM THE FIRST SENSOR
ELECTRODE
702
          ↓
RECEIVE SECOND RESULTING SIGNALS FROM A SECOND SENSOR
ELECTRODE OF THE SENSOR ELECTRODE PATTERN, THE SECOND
RESULTING SIGNALS COMPRISING EFFECTS CORRESPONDING TO
THE MODULATED SIGNAL, AND WHEREIN THE FIRST RESULTING
SIGNALS AND THE SECOND RESULTING SIGNALS ARE
SIMULTANEOUSLY RECEIVED
703
          ↓
DETERMINE A CHANGE IN CAPACITIVE COUPLING BETWEEN AN
INPUT OBJECT AND THE FIRST SENSOR ELECTRODE BASED ON THE
FIRST RESULTING SIGNALS AND CHANGE IN CAPACITIVE COUPLING
BETWEEN THE FIRST AND SECOND SENSOR ELECTRODES BASED
ON THE SECOND RESULTING SIGNALS
704
```

FIG. 7A

700 Continued

DRIVE A GUARDING SIGNAL ON A THIRD SENSOR ELECTRODE OF THE SENSOR ELECTRODE PATTERN, THE THIRD SENSOR ELECTRODE PROXIMATE THE FIRST SENSOR ELECTRODE, WHEREIN THE GUARDING SIGNAL IS IN-PHASE WITH THE MODULATED SIGNAL
705

FIG. 7B

700 Continued

DRIVE A SECOND MODULATED SIGNAL ON THE SECOND SENSOR ELECTRODE, WHEREIN THE SECOND MODULATED SIGNAL HAS A PHASE OPPOSITE THAT OF THE MODULATED SIGNAL, AND WHEREIN THE MODULATED SIGNAL AND THE SECOND MODULATED SIGNAL ARE DRIVEN CONCURRENTLY
706

FIG. 7C

700 Continued

RECEIVE THIRD RESULTING SIGNALS WITH A THIRD SENSOR ELECTRODE OF THE SENSOR ELECTRODE PATTERN, WHEREIN THE THIRD RESULTING SIGNALS ARE RECEIVED SIMULTANEOUSLY WITH THE FIRST AND SECOND RESULTING SIGNALS
713

FIG. 7F

Transcapacitive Scan 1310

1315 Capacitance between Sensor Electrodes = 1317 Transcapacitance Value M

Absolute Capacitive Scan 1320

1325 Capacitance between Sensor Electrodes and Input Object = 1327 Absolute Capacitance Value N Capacitive Sensing Determination Function A 1331

1335 Ratio ΔN/ΔM <= 1337 Threshold A → Combined Capacitive Sensing

1337 Threshold A < 1335 Ratio ΔN/ΔM < 1338 Threshold B → Combined Capacitive Sensing or Absolute Capacitive Sensing, depending on LGM condition 1335 Ratio ΔN/ΔM >= 1338 Threshold B → Absolute Capacitive Sensing

*FIG. 13*

TRANSCAPACITIVE AND ABSOLUTE CAPACITIVE SENSING PROFILES

CROSS REFERENCE TO RELATED APPLICATIONS

The present application is a continuation-in-part application of U.S. patent application Ser. No. 15/696,004, filed Sep. 5, 2017, and entitled "TRANSCAPACTIVE AND ABSOLUTE CAPACTIVE SENSING PROFILES." Thus, the present application claims benefit of U.S. patent application Ser. No. 15/696,004 under 35 U.S.C. § 120. U.S. patent application Ser. No. 15/696,004 is hereby incorporated in its entirety. U.S. patent application Ser. No. 15/696,004 claims benefit under 35 U.S.C. § 119(e) of U.S. Provisional Application No. 62/535,529, filed on Jul. 21, 2017, having at least one of the same inventors as the present application, and entitled, "TRANSCAPACITIVE AND ABSOLUTE CAPACITIVE SENSING PROFILES WITH DISPLAY DEVICES". U.S. Provisional Application No. 62/535,529 is incorporated herein by reference. U.S. patent application Ser. No. 15/696,004 is a continuation-in-part application of U.S. patent application Ser. No. 14/527,688, filed Oct. 29, 2014, that issued as U.S. Pat. No. 9,753,570 on Sep. 5, 2017, and entitled "COMBINED CAPACITIVE SENSING." Thus, U.S. patent application Ser. No. 15/696,004 claims benefit of U.S. patent application Ser. No. 14/527,688 under 35 U.S.C. § 120. U.S. patent application Ser. No. 14/527,688 is hereby incorporated in its entirety. U.S. patent application Ser. No. 14/527,688 claims benefit under 35 U.S.C. § 119(e) of U.S. Provisional Patent Application No. 61/953,671, filed on Mar. 14, 2014, and entitled "COMBINED CAPACITIVE SENSING," which is incorporated herein by reference.

FIELD

This disclosed technology generally relates to electronic devices and specifically to capacitive sensing profiles.

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic system.

SUMMARY

In general, in one aspect, the disclosed technology relates to a processing system. The processing system includes a sensor module comprising sensing circuitry coupled to a plurality of sensor electrodes in an input device, the sensor module configured to: drive a first modulated signal onto a first sensor electrode among the plurality of sensor electrodes and a second modulated signal onto a second sensor electrode among the plurality of sensor electrodes, receive, simultaneously, a first resulting signal from the first sensor electrode and a second resulting signal from the second sensor electrode, and generate, based at least in part on the first resulting signal and the second resulting signal, a first combination signal; and a determination module coupled to the plurality of sensor electrodes, the determination module configured to: determine, using the first sensor electrode, a first capacitive coupling between the first sensor electrode and an input object in a sensing region of the input device; determine, using the first sensor electrode and the second sensor electrode, a second capacitive coupling between the first sensor electrode and the second sensor electrode; determine whether a ratio of the first capacitive coupling to the second capacitive coupling exceeds a first predetermined threshold; determine whether the input device is disposed in a predetermined low ground mass state; determine, using the first combination signal, when the input device is not disposed in the predetermined low ground mass state, and when the ratio fails to exceed the first predetermined threshold, first positional information regarding a location of the input object in the sensing region; and determine, when the ratio fails to exceed the first predetermined threshold and when the input device is disposed in the predetermined low ground mass state, second positional information regarding the location of the input object in the sensing region using an absolute capacitive scan of the sensing region.

In general, in one aspect, the disclosed technology relates to an electronic system. The electronic system includes a display device; an input device comprising: a plurality of sensor electrodes comprising a first sensor electrode and the second sensor electrode, wherein the first sensor electrode is configured to drive a first modulated signal, and wherein the second sensor electrode configured to drive a second modulated signal; and receiver circuitry coupled to the first sensor electrode and the second sensor electrode, the receiver circuitry being configured to receive a first resulting signal from the first sensor electrode and a second resulting signal from the second sensor electrode, wherein the receiver circuitry is further configured to generate a combination signal based at least in part on the first resulting signal and the second resulting signal, wherein the input device is configured to determine, using the first sensor electrode, a first capacitive coupling between the first sensor electrode and an input object in a sensing region of the input device, wherein the input device is further configured to determine, using the first sensor electrode and the second sensor electrode, a second capacitive coupling between the first sensor electrode and the second sensor electrode, wherein the input device is further configured to determine whether a ratio of the first capacitive coupling to the second capacitive coupling exceeds a first predetermined threshold, wherein the input device is further configured to determine whether the input device is disposed in a predetermined low ground mass state, wherein the input device is further configured to determine, using the combination signal, when the input device is not disposed in the predetermined low ground mass state, and when the ratio fails to exceed the first predetermined threshold, first positional information regarding a location of the input object in the sensing region, and wherein the input device is further configured to determine, when the ratio fails to exceed the first predetermined threshold and when the input device is disposed in the predetermined low ground mass state, second positional information regarding the location of the input object in the sensing region using an absolute capacitive scan of the sensing region.

In general, in one aspect, the disclosed technology relates to a method of capacitive sensing. The method includes driving a first modulated signal onto a first sensor electrode in an input device and a second modulated signal onto a second sensor electrode in the input device; receiving, simultaneously, a first resulting signal from the first sensor electrode and a second resulting signal from the second sensor electrode; determining, using the first sensor electrode, a first capacitive coupling between the first sensor electrode and an input object in a sensing region of the input device; determining, using the first sensor electrode and the second sensor electrode, a second capacitive coupling between the first sensor electrode and the second sensor electrode; determining whether a ratio of the first capacitive coupling to the second capacitive coupling exceeds a first predetermined threshold; determining whether the input device is disposed in a predetermined low ground mass state; generating, based at least in part on the first resulting signal and the second resulting signal, a combination signal; determining, using the combination signal, when the input device is not disposed in the predetermined low ground mass state, and when the ratio fails to exceed the first predetermined threshold, first positional information regarding a location of the input object in the sensing region; and determining, when the ratio fails to exceed the first predetermined threshold and when the input device is disposed in the predetermined low ground mass state, second positional information regarding the location of the input object in the sensing region using an absolute capacitive scan of the sensing region.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements.

FIGS. 7A-7G show a flow diagram of an example method of capacitive sensing, according to various embodiments.

FIG. 13 shows an example of a hybrid capacitive sensing scheme in accordance with one or more embodiments.

DESCRIPTION OF EMBODIMENTS

The following Description of Embodiments is merely provided by way of example and not of limitation. Furthermore, there is no intention to be bound by any expressed or implied theory presented in the preceding Background, Summary, or Brief Description of Drawings or the following Description of Embodiments.

Overview of Discussion

Herein, various embodiments are described that provide input devices, processing systems, and methods that facilitate improved usability. In various embodiments described herein, the input device may be a capacitive sensing input device. In general, conventional capacitance sensing measures substantially one type of capacitance at a time with sensor electrodes of a sensor electrode pattern; typically, either an absolute capacitance associated with a sensor electrode or a transcapacitance measured between two non-parallel sensor electrodes. For example, conventionally a capacitive touch implementation may inadvertently measure some aspects of both absolute capacitance and transcapacitance at a point in time when attempting to measure only absolute capacitance or only transcapacitance. Not only are these conventional measurements inadvertent, but they are also not made in a way that they can be independently combined and the effects of each separated for reporting. Herein, systems, methods, and techniques for performing combined capacitive sensing, are disclosed. In general, combined capacitive sensing, as described herein, involves using a sensor electrode pattern to make numerous different types of capacitive measurements simultaneously (e.g., simultaneous measurement of absolute capacitance and one or more types of transcapacitance) such that the effect of user input on the different types of measurements may be used to determine a reported position of an input object or user interface response in response to user input.

Discussion begins with a description of an example input device with which or upon which various embodiments described herein may be implemented. An example sensor electrode pattern is then described. A general description of techniques for combined capacitive sensing with a sensor electrode pattern is provided along with some examples. This is followed by description of an example processing system and some components thereof which may be utilized for combined capacitive sensing. The processing system may be utilized with or as a portion of an input device, such as a capacitive sensing input device. Some more specific examples of combined capacitive sensing are illustrated and described in conjunction with an example sensor electrode pattern. Operation of the example input devices, processing system, and components thereof are then further described in conjunction with description of an example method of combined capacitive sensing.

Example Input Device

Figure 1:
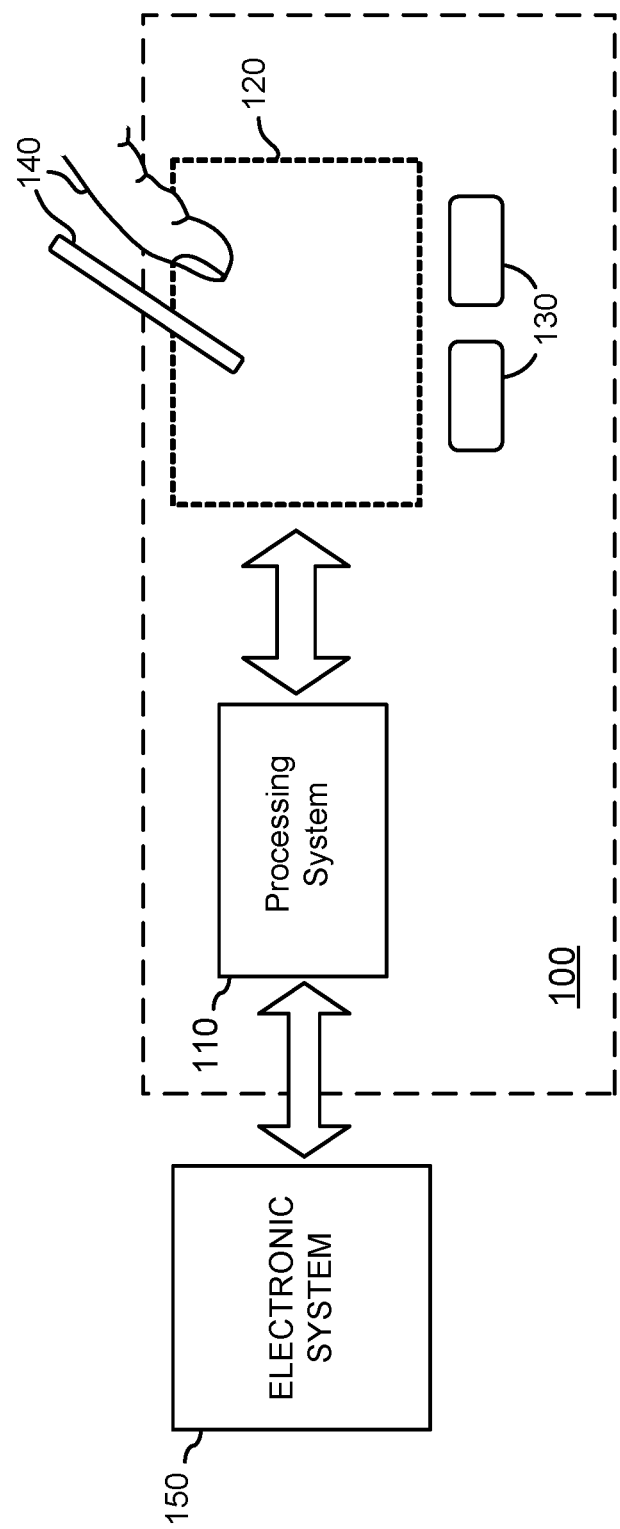
FIG. 1 is a block diagram of an example input device, in accordance with embodiments.

Turning now to the figures, FIG. 1 is a block diagram of an exemplary input device 100, in accordance with various embodiments. Input device 100 may be configured to provide input to an electronic system/device 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic systems could be a host or a slave to the input device.

Input device 100 can be implemented as a physical part of an electronic system 150, or can be physically separate from electronic system 150. As appropriate, input device 100 may communicate with parts of the electronic system using any one or more of the following: buses, networks, and other wired or wireless interconnections. Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. Example input objects include fingers and styli (passive and active), as shown in FIG. 1.

Sensing region 120 encompasses any space above, around, in and/or near input device 100, in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, transparent lenses over a touch screen display, etc. In some embodiments, sensing region 120 has a rectangular shape when projected on to an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. In one embodiment, the capacitive coupling between the sensor electrodes and input objects may be combined with the effects of the input on coupling between sensor electrodes to estimate the total coupling of the user to the reference voltage and/or to estimate low ground mass (LGM).

Some capacitive implementations utilize "mutual capacitance" (also referred to herein as "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). In some embodiments, a transcapacitance is measured between a transmitter electrode and a receiver that cross one another. In some embodiments, a transcapacitive measurement is made between a transmitter electrode and a receiver electrode which do not cross one another. Collectively transmitters and receivers may be referred to as sensor electrodes or sensor elements. Transmitter sensor electrodes may be modulated relative to a reference voltage (e.g., system ground, a stationary voltage potential, or a modulated voltage signal) to transmit transmitter signals. Receiver sensor electrodes may be coupled with the reference voltage to facilitate receipt of resulting signals. A resulting signal may comprise effect(s) corresponding to one or more transmitter signals, and/or to one or more sources of environmental interference (e.g., actively modulated pen or other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. For example, a processing system for may comprise transmitter circuitry configured to transmit signals with transmitter sensor electrodes, and/or receiver circuitry configured to receive signals with receiver sensor electrodes. Such transmitter circuitry may include one or more analog components such as amplifiers (e.g., buffers) which are used to drive transmitter signals onto sensor electrodes. Such receiver circuitry may include one or more analog components such as amplifiers which are used to receive and amplify signals from the sensor electrodes. In some embodiments, some analog components are shared between transmitter circuitry and receiver circuitry. In various embodiments, one or more analog components of the transmitter and/or receiver circuitry may be used for both transcapacitive and absolute capacitive sensing. In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing system 110 also performs other functions, such as operating display screens, containing a display buffer driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor modules configured to operate sensing element(s) to detect input, determination modules configured to determine absolute capacitance and positions of any inputs objects therefrom, determination modules configured to determine changes in transcapacitance and positions of any input objects therefrom, to combine changes in transcapacitance and absolute capacitance to determine positions of any input objects therefrom, and/or to determine interference or actively modulated user inputs and determine their user input state (e.g., excessive noise, hover, contact force, button press etc.), identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g., to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active area of a display screen. For example, input device 100 may comprise substantially transparent (including but not limited to opaque metal meshes) sensor electrodes overlaying the display screen and provide a touch screen interface for the associated electronic system 150. A metal mesh over a display may be designed to minimize visible Moire' patterns with the subpixel patterns below, and to minimize reflection of light from above. In one embodiment the mesh may be patterned to substantially surround each subpixel while allowing sufficient (e.g. greater than +/−75 degree) and patterned to segment the electrodes (e.g. into orthogonal X and Y axis diamond electrodes). The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Figure 2A:
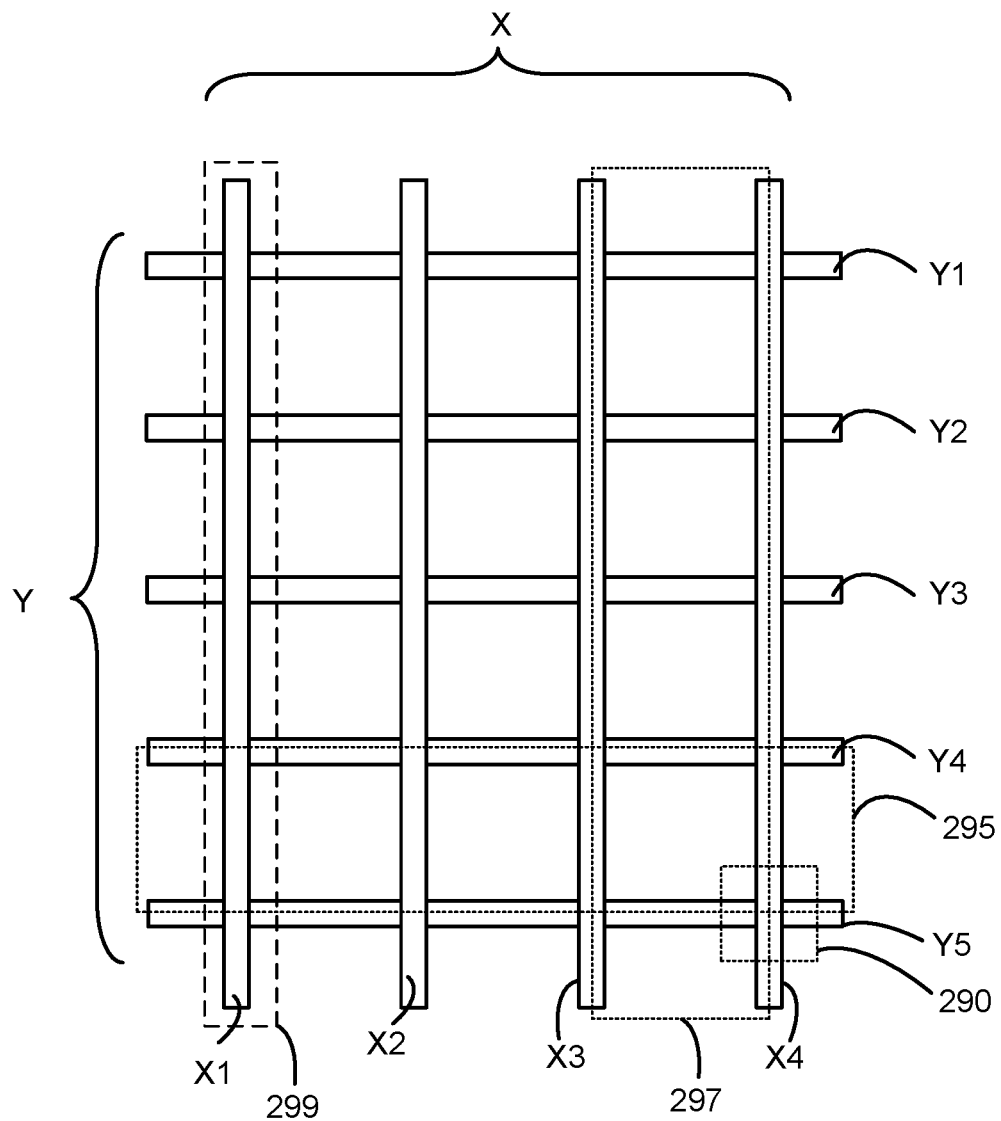
FIG. 2A shows a portion of an example sensor electrode pattern which may be utilized in a sensor to generate all or part of the sensing region of an input device, such as a touch screen, according to some embodiments.

FIG. 2A shows a portion of an example sensor electrode pattern 200 which may be utilized in a sensor to generate all or part of the sensing region of input device 100, according to various embodiments. Input device 100 is configured as a capacitive sensing input device when utilized with a capacitive sensor electrode pattern. For purposes of clarity of illustration and description, a non-limiting simple rectangular sensor electrode pattern 200 with a first plurality of sensor electrodes X and a second plurality of sensor electrodes Y is illustrated. Although the labels X and Y are utilized and FIG. 2A illustrates that the X and Y sensor electrode subsets are substantially orthogonal to one another, an orthogonal relationship between the crossing first and second subsets of sensor electrodes is not required. In one embodiment, the sensor electrodes X and Y may be arranged on different sides of the same substrate. For example, each of the first plurality X and second plurality of sensor electrode may be disposed on one of the surfaces of a substrate. In one such an embodiment, sensor electrodes X are disposed on a first side of a substrate, while sensor electrodes Y are disposed on an opposing side of the substrate. In other embodiments, the sensor electrodes may be arranged on different substrates. For example, each of the each of the first and second plurality of sensor electrode(s) may be disposed on surfaces of separate substrates which may be adhered together. In another embodiment, the sensor electrodes are all located on the same side or surface of a common substrate. In one example, a first plurality of the sensor electrodes comprises jumpers in regions where the first plurality of sensor electrodes crossover the second plurality of sensor electrodes, where the jumpers are insulated from the second plurality of sensor electrodes. In one or more embodiments, the sensor electrodes may comprise at least one display electrode configured for display updating and capacitive sensing. The display electrode may be selected from a list comprising, but not limited to, a segment of a segmented Vcom electrode, a source electrode, a gate electrode, a cathode electrode, and an anode electrode.

The first plurality of sensor electrodes may extend in a first direction, and the second plurality of sensor electrodes may extend in a second direction. The second direction may be similar to or different from the first direction. For example, the second direction may be parallel with, perpendicular to, or diagonal to the first direction. Further, the sensor electrodes may each have the same size or shape or differing size and shapes. In one embodiment, the first plurality of sensor electrodes may be larger (larger surface area) than the second plurality of sensor electrodes. In other embodiments, the first plurality and second plurality of sensor electrodes may have a similar size and/or shape. Thus, the size and/or shape of the one or more of the sensor electrodes may be different than the size and/or shape of another one or more of the sensor electrodes. Nonetheless, each of the sensor electrodes may be formed into any desired shape on their respective substrates.

In other embodiments, one or more of sensor electrodes are disposed on the same side or surface of the common substrate and are isolated from each other in the sensing region 120.

Figure 2B:
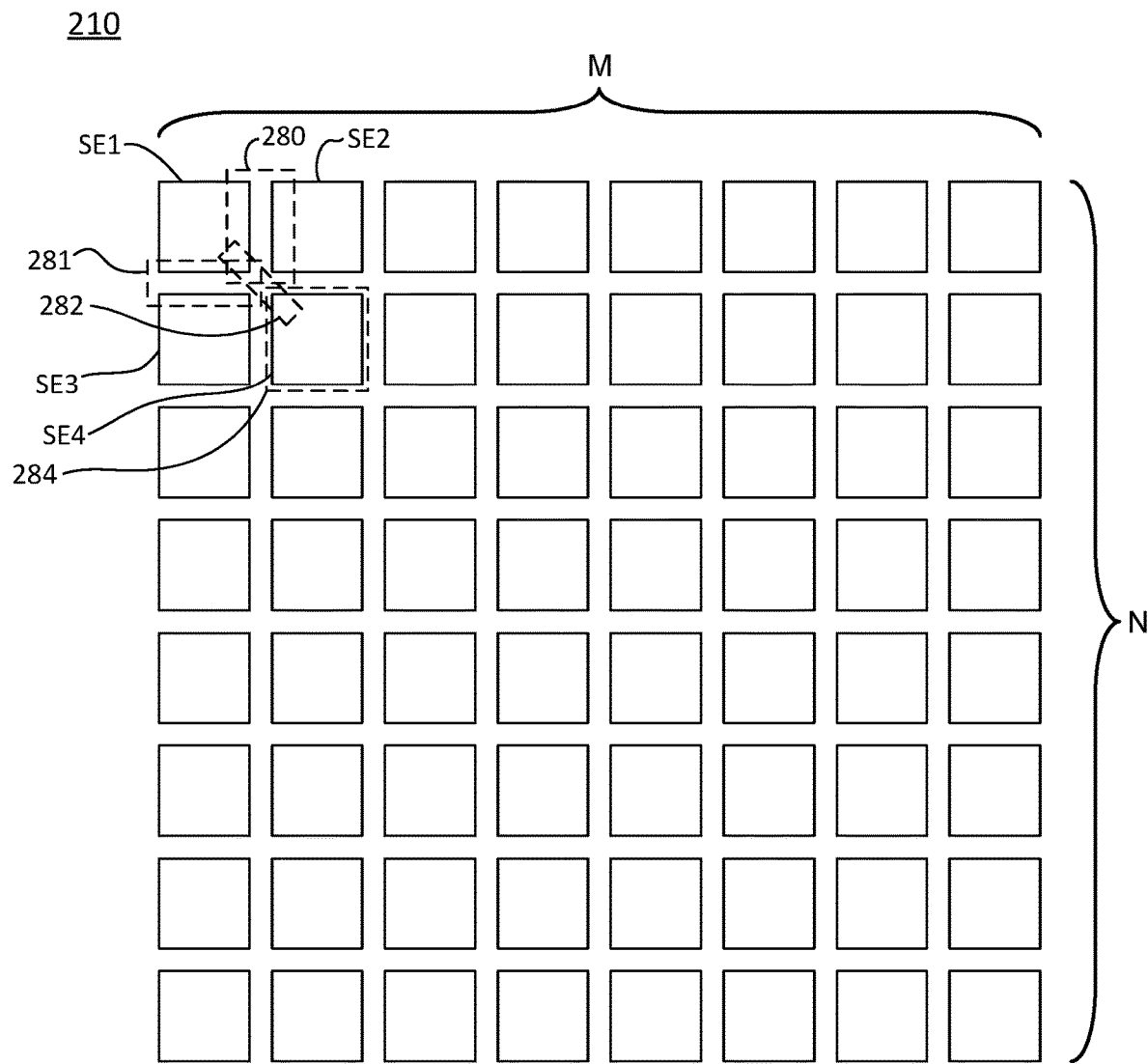
FIG. 2B illustrates an example matrix array of sensor electrodes, according to various embodiments.

FIG. 2B illustrates an example matrix array of sensor electrodes, according to various embodiments. As illustrated in FIG. 2B, the sensor electrodes 210 may be disposed in a matrix array where each sensor electrode may be referred to as a matrix sensor electrode. In one embodiment, each sensor electrode of sensor electrodes is substantially similar size and/or shape. In one embodiment, one or more of sensor electrodes of the matrix array of sensor electrodes may vary in at least one of size and shape. Each sensor electrode of the matrix array may correspond to a pixel of a capacitive image. Further, two or more sensor electrodes of the matrix array may correspond to a pixel of a capacitive image. In various embodiments, each sensor electrode of the matrix array may be coupled a separate capacitive routing trace of a plurality of capacitive routing traces. In various embodiments, the sensor electrodes 210 comprises one or more gird electrodes disposed between at least two sensor electrodes of sensor electrodes. The grid electrode and at least one sensor electrode may be disposed on a common side of a substrate, different sides of a common substrate and/or on different substrates. In one or more embodiments, the sensor electrodes and the grid electrode(s) may encompass an entire voltage electrode of a display device. The voltage electrode may be selected from a list comprising, but not limited to, a Vcom electrode, a segment of a segmented Vcom electrode, a source electrode, a gate electrode, a cathode electrode, and an anode electrode. Although the sensor electrodes may be electrically isolated on the substrate, the electrodes may be coupled together outside of the sensing region 120—e.g., in a connection region. In one embodiment, a floating electrode may be disposed between the grid electrode and the sensor electrodes. In one particular embodiment, the floating electrode, the grid electrode and the sensor electrode comprise the entirety of a common electrode of a display device. Each sensor electrode may be individually coupled to the processing system or coupled to the processing system through one or more multiplexers or switching mechanisms.

The illustrated sensor electrode pattern in FIG. 2A is made up of a plurality of sensor electrodes X (X1, X2, X3, X4) which may be used as both transmitter electrodes and receiver electrodes and a plurality of sensor electrodes Y (Y1, Y2, Y3, Y5) which may be used as both transmitter electrodes and receiver electrodes. Sensor electrodes X and Y overlay one another in an orthogonal arrangement, in this example. It is appreciated that in a crossing sensor electrode pattern, such as the illustrated example of FIG. 2A, some form of insulating material or substrate is typically disposed between sensor electrodes Y and X. For purposes of clarity, depictions of these substrates and insulators have been omitted herein.

In the illustrated example of FIG. 2A, capacitive pixels may be measured via transcapacitive sensing. For example, capacitive pixels may be located at regions where transmitter and receiver electrodes interact. The pixels may have a variety of shapes, depending on the nature of the interaction. In the illustrated example, capacitive pixels are located where transmitter and receiver electrodes overlap one another. Capacitive coupling 290 illustrates one of the capacitive couplings generated by sensor electrode pattern 200 during transcapacitive sensing with sensor electrode Y5 as a transmitter electrode and sensor electrode X4 as a receiver electrode or with sensor electrode X4 as a transmitter electrode and sensor electrode Y5 as a receiver electrode. Capacitive coupling 295 illustrates one of the capacitive couplings generated by sensor electrode pattern 200 during transcapacitive sensing with sensor electrode Y5 as a transmitter electrode and sensor electrode Y4 as a receiver electrode or with sensor electrode Y4 as a transmitter electrode and sensor electrode Y5 as a receiver electrode. Capacitive coupling 297 illustrates one of the capacitive couplings generated by sensor electrode pattern 200 during transcapacitive sensing with sensor electrode X4 as a transmitter electrode and sensor electrode Y3 as a receiver electrode or with sensor electrode X3 as a transmitter electrode and sensor electrode X4 as a receiver electrode. When accomplishing transcapacitive measurements, the capacitive couplings, are areas of localized capacitive coupling between sensor electrodes. The capacitive coupling between sensor electrodes change with the proximity and motion of input objects in the sensing region associated with sensor electrodes. In some instances, areas of capacitive coupling such as 290, 295, and 297 may be referred to as capacitive pixels. It should be noted that the different types of capacitive couplings 290, 295, 297 have different shapes, sizes, and or orientations from one another due to the particular nature of the interactions. As another example, absolute capacitive couplings may increase where the area of overlap between a sensor electrode and a user input depending on the series coupling of the user through a voltage reference (e.g., system ground) from which the respective receiver is modulated. As one example, dashed box 299 represents an area of absolute capacitive coupling which may be associated with sensor electrode X1; other sensor electrodes similar have areas of absolute capacitive coupling. As a further example, the absolute capacitive series couplings may also include the effect of user coupling to other transmitter electrodes in parallel to the coupling to the reference voltage.

In the illustrated example of FIG. 2B, capacitive pixels may be measured via transcapacitive sensing. For example, capacitive pixels may be located at regions where transmitter and receiver electrodes interact. In the illustrated example, capacitive pixels are located where transmitter and receiver electrodes are coupled to one another. For example, capacitive coupling 280 illustrates one of the capacitive couplings generated by sensor electrode pattern 210 during transcapacitive sensing with sensor electrode SE1 as a transmitter electrode and sensor electrode SE2 as a receiver electrode or with sensor electrode SE1 as a transmitter electrode and sensor electrode SE2 as a receiver electrode. Capacitive coupling 281 illustrates one of the capacitive couplings generated by sensor electrode pattern 210 during transcapacitive sensing with sensor electrode SE1 as a transmitter electrode and sensor electrode SE3 as a receiver electrode or with sensor electrode SE3 as a transmitter electrode and sensor electrode SE1 as a receiver electrode. Capacitive coupling 282 illustrates one of the capacitive couplings generated by sensor electrode pattern 210 during transcapacitive sensing with sensor electrode SE1 as a transmitter electrode and sensor electrode SE4 as a receiver electrode or with sensor electrode SE4 as a transmitter electrode and sensor electrode SE1 as a receiver electrode. When accomplishing transcapacitive measurements, the capacitive couplings, are areas of localized capacitive coupling between sensor electrodes. The capacitive coupling between sensor electrodes changes with the proximity and motion of input objects in the sensing region associated with sensor electrodes. As one example, dashed box 284 represents an area of absolute capacitive coupling which may be associated with sensor electrode SE4; other sensor electrodes in sensor electrode pattern 210 similar have areas of absolute capacitive coupling. The absolute capacitance of any one or more of the sensor electrodes in sensor electrode pattern 210 may also be measured. For purposes of brevity and clarity, the embodiments discussed in FIGS. 3A-7G are described using the example sensor electrode pattern 200 of FIG. 2A. It should be appreciated by one of skill in the art that the embodiments described in FIGS. 3A-7G can similarly be implemented using a variety of other sensor electrode patterns, including sensor electrode pattern 210 of FIG. 2B.

In some embodiments, sensor electrode pattern 200 is "scanned" to determine these capacitive couplings. That is, the transmitter electrodes are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes to be independently determined based on the multiple results of multiple independent codes. In one embodiment, a first sensor electrode may be driven with a first transmitter signal based on a first code of a plurality of distinct digital codes and a second sensor electrode may be driven with a second transmitter signal based on a second code of the plurality of distinct digital codes, where the first code may be orthogonal to the second code. With regard to FIG. 2B, the sensor electrodes may be driven and received with such that at least two sensor electrodes may be simultaneously driven. In one or more embodiments, each of the sensor electrodes may be simultaneously driven. In such an embodiment, each sensor electrode may be driven with a transmitter signal based on a different one of a plurality of orthogonal digital codes. Further, the sensor electrodes may be driven such that a first at least one sensor electrode is driven differently that a second at least sensor electrode. In one or more embodiments, the sensor electrodes are driven such that along each row and column alternating sensor electrodes are driven differently.

The receiver electrodes may be operated singly or in multiples to acquire resulting signals. The resulting signals may be used to determine measurements of the capacitive couplings at the capacitive pixels. Note that the receiver signals may also be multiplexed such that multiple electrodes may be measured with a single receiver (e.g., analog front end or "AFE"). Furthermore, the receiver multiplexer may be implemented such that the receiver is simultaneously coupled to and simultaneously receives resulting signals from multiple sensor electrodes. In such implementations, the resulting signals comprise coded results from the multiple sensor electrodes. Note in various embodiments, that multiple "absolute capacitance" electrodes may be driven simultaneously with the same modulation relative to a reference voltage and such that they are guarding each other, or some may be driven relative to each other modulated relative to a system reference voltage such that they measure both a transcapacitive and an absolute capacitive signal simultaneously.

A set of measurements from the capacitive couplings or pixels form a "capacitive image" (also "capacitive frame") representative of the transcapacitive couplings a. For example, a capacitive image may be made up of a set of capacitive pixels, such as capacitive coupling 290. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region. Also, in various embodiments, a "capacitive image" may be formed by absolute capacitive measurements of a matrix array of sensor electrodes (e.g., sensor electrode pattern 210 of FIG. 2B). In such embodiments, sensor electrodes may be operated for absolute capacitive sensing depending on the multiplexer settings. For example, the sensor electrodes may be grouped into rows, columns and/or other combinations of sensor electrodes.

A set of measurements from the capacitive coupling/ pixels along one axis may be taken to form a "transcapacitive profile" (also "profile frame") representative of the capacitive couplings at the capacitive couplings/pixels between parallel electrodes on an axis (e.g., electrodes X or Y). For example, a transcapacitive profile may be made up from a set of horizontal capacitive pixels, such as capacitive coupling/pixel 295, or from a set of vertical pixels, such as capacitive coupling/pixel 297. Multiple transcapacitive profiles along one or more axes may be acquired over multiple time periods, and differences between them used to derive information about input in the sensing region. For example, successive transcapacitive profiles acquired over successive periods of time for an axis can be used to track the motion(s) of one or more input objects entering, exiting, and within the sensing region. Alternately, a set of measurements from the capacitive coupling along an axis may be taken from an "absolute capacitive profile" (also called "ABS profile") representative of the capacitive couplings between the parallel electrodes on an axis and the series capacitance from the user input through the coupling to the reference electrode which the absolute receivers are modulated.

In some embodiments, one or more sensor electrodes Y or X may be operated to perform absolute capacitive sensing at a particular instance of time. For example, sensor electrode X1 may be charged by driving a modulated signal onto sensor electrode X1, and then the capacitance of receiver electrode X1 to system reference voltage including the coupling through the user input may be measured. In such an embodiment, an input object 140 interacting with sensor electrode X1 alters the electric field near sensor electrode X1, thus changing the measured capacitive coupling. In this same manner, a plurality of sensor electrodes X and/or sensor electrodes Y may be used to measure absolute capacitance at different times or at times that overlap partially or completely.

As will be described herein, in some embodiments, combined sensing can be performed by driving a sensing signal onto a sensor electrode (e.g., sensor electrode X1) for the purposes of measuring absolute capacitance with that sensor electrode and, simultaneously with the driving of that sensor electrode, other sensor electrodes that cross and do not cross that sensor electrode (e.g., sensor electrodes Y that cross sensor electrode X1 and one or more other sensor electrodes X which do not cross sensor electrode X1) may be used as receivers to obtain transcapacitive measurements between themselves and the driven sensor electrode.

Figure 3A:
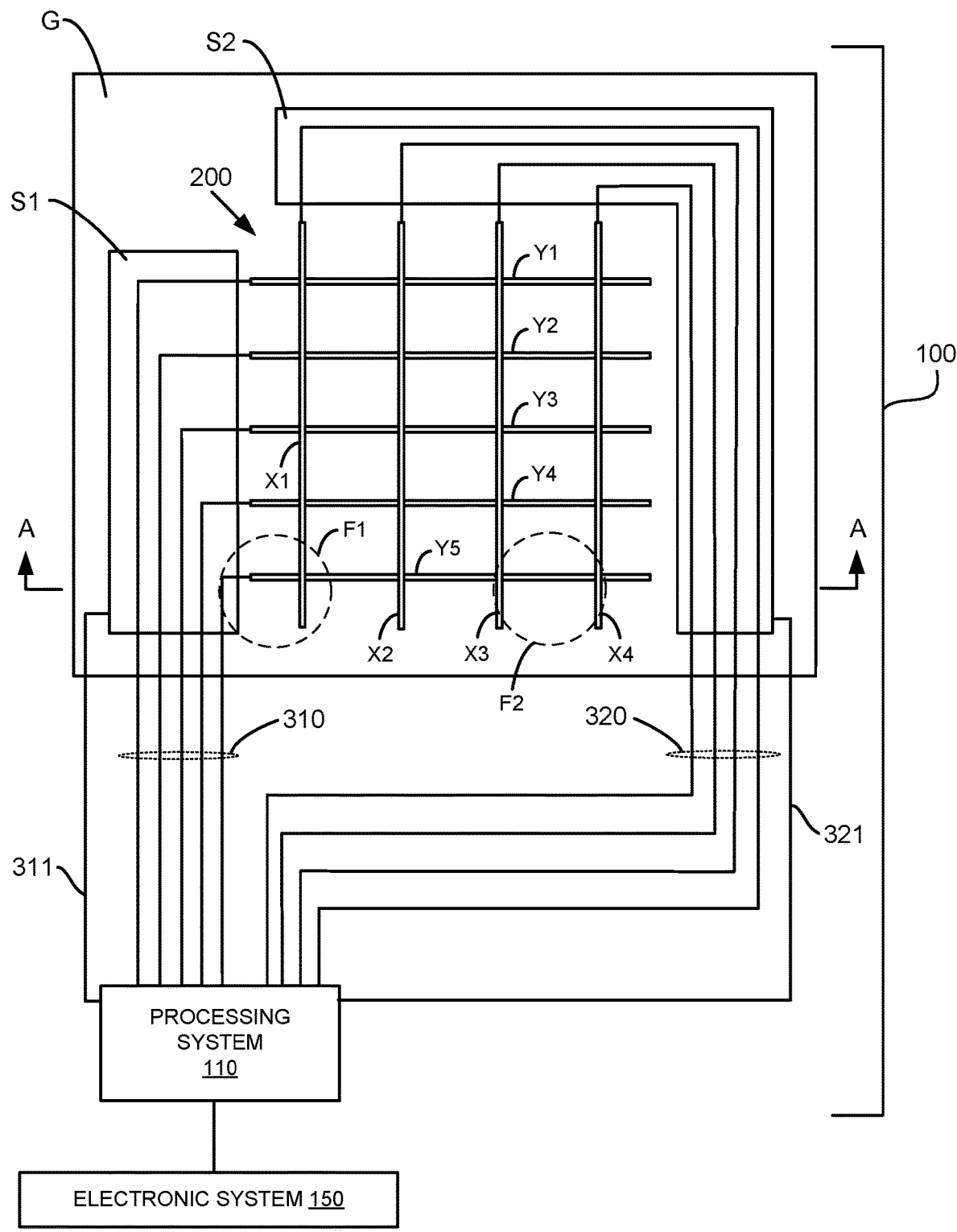
FIG. 3A shows more detailed block diagram of the input device of FIG. 1, according to an embodiment.

FIG. 3A shows a more detailed block diagram of the input device 100 of FIG. 1, according to an embodiment. By way of example and not of limitation, FIG. 3A depicts and describes a crossing sensor electrode pattern as shown in FIG. 2A; however, it should be appreciated that the description and techniques presented with respect to FIG. 3A may similarly be applied to the sensor electrode pattern 210 of FIG. 2B. In FIG. 3A capacitive sensing input device 100, in the illustrated embodiment, includes sensor electrodes of sensor electrode pattern 200. It should be appreciated that for purposes of clarity some components such as substrates, insulating material, and routing traces are omitted so as not to obscure the depicted portions. Sensor electrodes X and Y or sensor electrode pattern 200 are shown coupled by routing traces to processing system 110. For example, routing traces 310 couple sensor electrodes Y1, Y2, Y3, Y4, and Y5 with processing system 110, and routing traces 320 couple sensor electrodes X1, X2, X3, and X4 with processing system 110. Sensor electrode pattern 200 is disposed above a conductive system electrode G. The system electrode may be driven with a system reference, which may also be referred to as a system ground. In one or more embodiments, the system electrode G may be part of the housing of the input device, or the battery of the input device. In one or more embodiments an optional electrode B (depicted in FIG. 3B but not in FIG. 3A) may be disposed between the sensor electrodes and system ground electrode. Electrode B may be driven with a shielding signal, which may be a substantially constant voltage or a varying voltage (i.e., guard signal).

Electrode S1 overlaps at least a portion of routing traces 310, and may be used to shield signals on these routing traces. Electrode S1 is coupled with processing system 110 by routing trace 311 and may be held at a constant voltage potential or modulated by processing system 110. An electrode S2 overlaps at least a portion of routing traces 320, and may be used to shield signals on these routing traces. Electrode S2 is coupled with processing system 110 by routing trace 321 and may be held at a constant voltage potential or modulated by processing system 110. As illustrated, in some embodiments, input device 100 is communicatively coupled with electronic system 150. In one embodiment, the constant voltage potential may be the system reference. In other embodiments, the constant voltage potential may be any substantially constant voltage.

In one embodiment, change in the position of an input object, such as finger F1, may also change the capacitances $C_{Y5X1}$ or $C_{Y5X3}$. Moreover, another input object, such as finger F2, may be further away from the sensor electrodes than finger F1 and may have no or very minimal substantially effect on $C_{X3F2}$, $C_{X4F2}$, and $C_{X4F2}$.

Figure 3B:
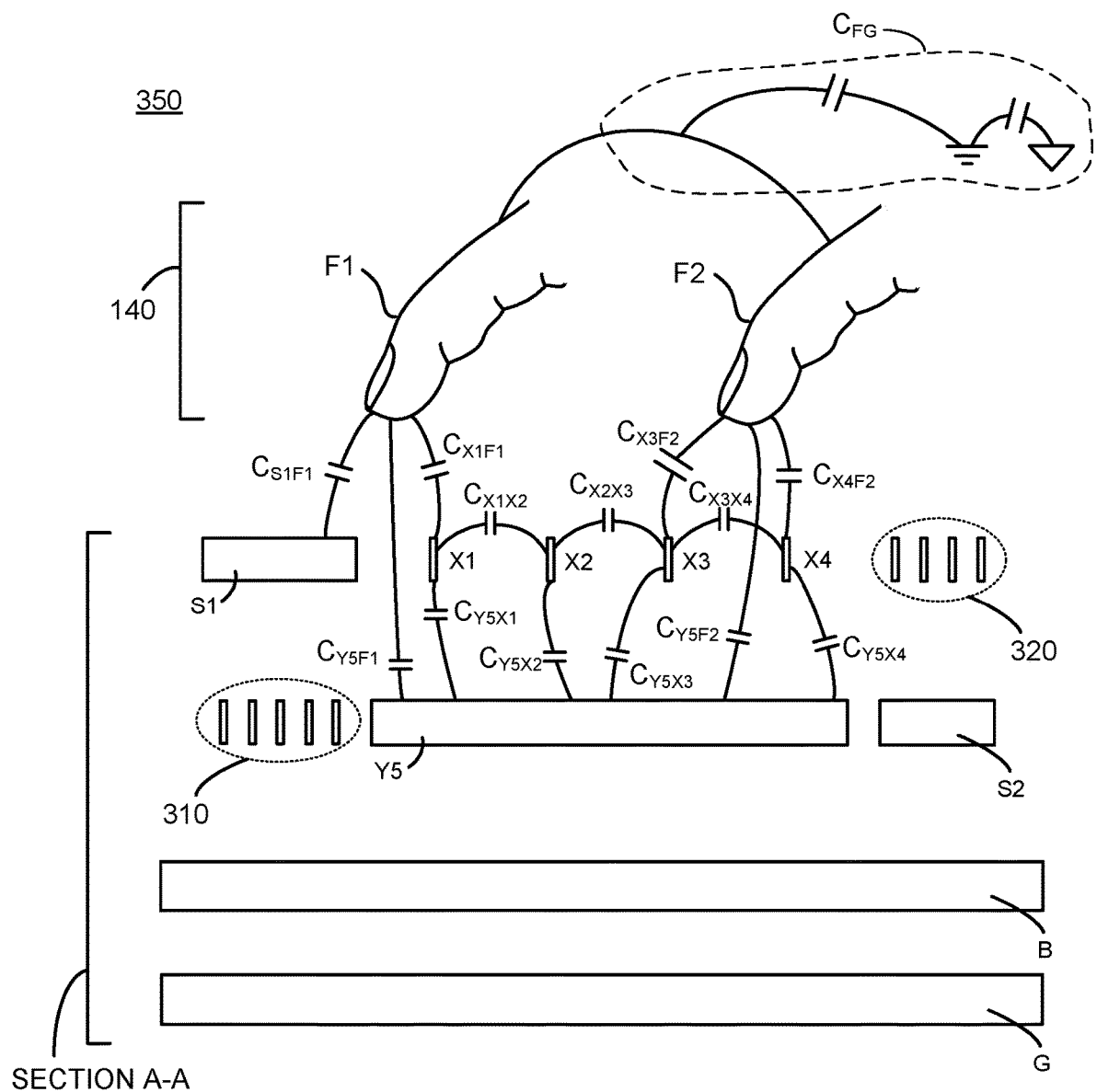
FIG. 3B shows an exploded side sectional view of a portion of the input device of FIG. 3A, according to an embodiment.

In FIG. 3A, Arrows A, represent the location and direction of a front side-sectional view that is illustrated in FIG. 3B. Additionally, in FIG. 3A, circle F1 represents the interaction area of a finger, F1, that is illustrated in FIG. 3B; while circle F2 represents the interaction are of a finger, F2, that is also illustrated in FIG. 3B.

FIG. 3B shows an exploded side sectional view A-A of a portion of the input device of FIG. 3A, according to an embodiment. As with FIG. 3A, portions such as substrates, insulators, and routing traces have been omitted for the purposes of clarity so as not to obscure the depicted portions. In the illustrated embodiment, it can be seen that electrode S1 is disposed in the same layer as sensor electrodes X, and electrode S2 is disposed in the same layer as sensor electrodes Y. In other embodiments, sensor electrodes S1 and S2 may be disposed in the same layer as one another or in different layers than depicted; for example, electrode S2 may be disposed above routing traces 320 rather than below as depicted, and sensor electrode S1 may be disposed below routing traces 310 rather than above as depicted. In addition to section A-A, two input objects 140 in the form of a first finger, F1, and a second finger, F2, are shown along with a variety of capacitive couplings within and to the sensor electrodes X and Y of sensor electrode pattern 200.

With an array of sensing electrodes, such as sensor electrode pattern 200, which are arranged in a crossing array where two sets of sensor electrodes (sensor electrodes X and sensor electrodes Y) are roughly parallel within the set, the sets may effectively couple together in a set of capacitive combinations larger than that within either set separately (e.g., the electrode sets may be roughly perpendicular between them). Consider an example where there are M sensor electrodes in the set of X sensor electrodes and N sensor electrodes in the set of Y electrodes. Where the sets of X and Y sensor electrodes are roughly orthogonal, in areas where they extend to cover each other there will be capacitances described by transcapacitance between the sets (e.g., $C_{X1Y2}$ and $C_{Y2X1}$ for a total number of crossings of up to 2*(M*N)). There will also be capacitances described by absolute capacitance up to M+N=P) from each of the electrodes to a chassis ground (e.g., $C_{X1X1}$ or $C_{Y2Y2}$). Further within the sets there will be capacitances described by transcapacitance, which are within the parallel sets (e.g., up to M*(M−1) and N*(N−1) additional capacitances like $C_{X1X2}$ and $C_{Y1Y2}$).

In general, the number of set-to-set transcapacitances, intra-set transcapacitances, and absolute capacitances, will be a matrix of all capacitances between each of the sets of electrodes (e.g., $P^2=[M+N]^2$). There may also be other electrodes comprising relatively stationary (to system ground) shields, or modulated electrodes (e.g., guards) which may minimize uncontrolled capacitive coupling, or others that may interfere randomly or by increasing the required dynamic range of capacitive measurement. In various embodiments, the number of capacitances vary based on the sensor electrode pattern, and in various embodiments, the sensor electrode pattern may be configured to provide a predetermined number of absolute, set-to-set transcapacitances and/or intra-set transcapacitances. For example, with reference to the sensor electrode pattern shown in FIG. 2B, $(N*M)^2$ capacitances may be determined, where N is the number of sensor electrodes disposed along a first axis (e.g., along X axis) and M is the number of sensor electrodes disposed along a second axis (e.g., along Y axis).

The chassis of input device 100 may in turn be coupled to free-space and/or to one or more conductive input objects. Those objects may be effectively AC grounded (to the chassis) either by contact or through free-space, or they may be effectively "floating." Further high (relative to vacuum or air) dielectric objects may also exist and change capacitive couplings of the array of sensor electrodes in sensor electrode pattern 200. For example, the sensitivity of the capacitive measurement of the transcapacitances and the cross coupling of capacitances may be reduced (shielded) or increased (coupled through the sensor electrode) respectively when the capacitive coupling of the chassis with the input object is high or low respectively. In particular this may tend to make simple measurements of the capacitances more difficult in some instances when conventional measurement techniques are employed.

As previously described, the array of sensor electrodes in sensor electrode pattern 200 may comprise transmitters and receivers, where most generically each of the sensor electrodes may be a transmitter (modulated relative to system ground), a receiver which measures charge (or modulated currents) coupled through the capacitances of transmitters modulated relative to them (e.g., stationary in voltage relative to the chassis ground), or both (e.g., an absolute capacitance sensitive receiver modulated relative to ground which measures that capacitance and also any other relatively modulated electrodes). The sensor electrodes may also be decoupled from low impedance outputs/inputs such that their other couplings dominate and coupling between occur (e.g., reduced shielding/guarding). The capacitances in sensor electrode pattern 200 may then be estimated by measuring the charge to voltage ratio (e.g., measuring charge for a fixed voltage modulation, or measuring voltage for a fixed charge modulation). In some embodiments, when the coupling from an input object to system ground is low, the direct coupling between sensor electrodes can increase (e.g., the intra-set transcapacitance may increase or the increased coupling through the input object may be comparable to the reduced direct coupling between sets). In such embodiments, changes to the electric field due to the input object may be low. This makes conventional estimations of the capacitances (e.g., $C_{X1Y1}$ and $C_{X4Y2}$) based on single measurements of charge versus voltage inaccurate and in some embodiments, it may be indeterminable. However, by correlating multiple measurements, independent estimates of direct coupling capacitances (e.g., similar to those where the input is fully grounded) can be made and input locations based on those corrected estimates.

For example, combined capacitive sensing can be employed by scanning when all electrodes are receivers (e.g., modulating each electrode in sequence while receiving on the others) will generate a P*P matrix (of measured capacitance or demodulated charge) where the total number of electrodes is P=M+N. In the P*P matrix there are two set-to-set capacitive images (since each symmetric capacitance is measured twice, e.g., $C_{X1Y4}$ and $C_{Y4X1}$) so two reports may be generated when all of the electrodes are scanned. Such inter-set capacitive images may also be referred to as transcapacitive images as they are made up of transcapacitive measurements. There are also two pairs of other intra-set transcapacitance profiles (M×M and N×N respectively) and two absolute capacitance profiles (a vector of M and a vector of N). In the case where user input coupling to system ground is known, corrections can be made to the images. However, it is possible for multiple levels of input coupling to be present (e.g., a "floating" coin and a grounded finger) simultaneously. This makes the location of the objects and their introduction and removal difficult to distinguish with a single, conventional measurement of transcapacitance at each crossover location. However, by correlating various capacitance measurements the degree of coupling can be estimated and in various embodiments, it can be locally estimated.

Note that, when performing combined capacitive sensing, the different measurements of both the same symmetric capacitance (though measured at a different time) or of different types of capacitance (e.g., absolute capacitance, set-to-set transcapacitance, and intra-set transcapacitance) may be correlated with each other to better interpret the input signals (e.g., even when they are changing or when the ground coupling of the user is low).

With reference to FIGS. 3A and 3B, the charges transferred by the different capacitances (e.g., absolute capacitances such as $C_{X1F1}$, $C_{X3F2}$, $C_{X4F2}$, $C_{Y5F1}$, $C_{Y5F2}$; set-to-set transcapacitances $C_{Y5X1}$, $C_{Y5X2}$, $C_{Y5X3}$, $C_{Y5X4}$; and intra-set transcapacitances such as $C_{X1X2}$, $C_{X2X3}$) all occur at substantially same time along with other capacitances (e.g., $C_{F1S1}$, $C_{FG}$, and $C_{F2B}$) but the coupling through input objects can confound the normal (e.g., well-grounded user input) assumptions about their effect simply on transcapacitances collected according conventional sensing techniques. This can lead to bad baselines and Low Ground Mass (LGM) effects that are difficult to disambiguate from moisture or multiple input objects when conventional capacitive sensing techniques are employed. However, when using combined capacitive sensing techniques described herein the coupling of an input object to ground can be determined by either the reduced charge coupling of an object on an absolute profile measurement or by the increased charge coupling on a transcapacitance measurement or a combination of both.

Figure 4:
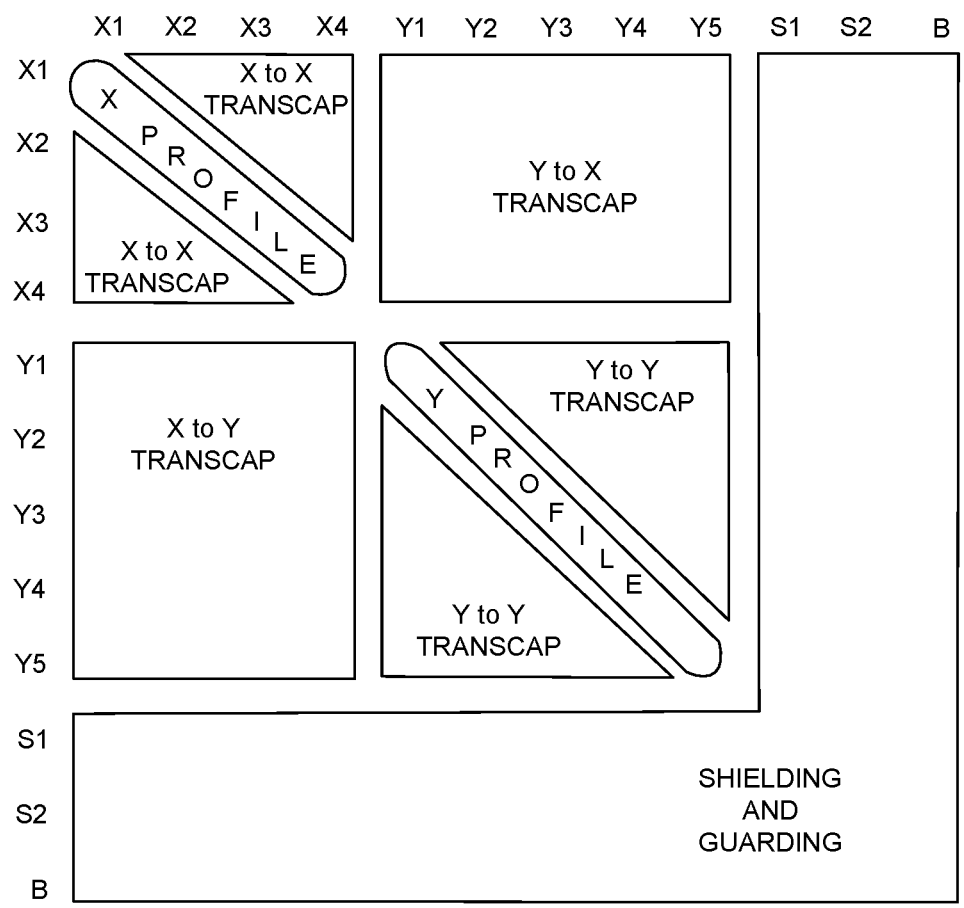
FIG. 4 shows a matrix of capacitances associated with the input device illustrated in FIGS. 3A and 3B, according to an embodiment.

FIG. 4 shows a matrix 400 of capacitances associated with the input device illustrated in FIG. 3A, according to an embodiment. The multiple capacitances illustrated in matrix 400 may be acquired via techniques of combined capacitive sensing, in some embodiments. For example, absolute capacitances such as $C_{X1X1}$ . . . $C_{X4Y4}$ form an X profile; absolute capacitances such as $C_{Y1Y1}$ . . . $C_{Y5Y5}$ form a Y profile; set-to-set transcapacitances such as $C_{X1Y1}$ form an X to Y capacitive image; set-to-set transcapacitances such as $C_{Y1X1}$ form an Y to X capacitive image; intra-set transcapacitances such as $C_{X1X2}$ and $C_{X2X1}$ form an X to X transcapacitive profile; intra-set transcapacitances such as $C_{Y1Y2}$ and $C_{Y2Y1}$ form a Y to Y transcapacitive profile; and other capacitances to the shields, guards, and system ground electrode G, such as $C_{F1S1}$ and $C_{FG}$, round out the matrix. In various embodiments, a first sensor electrode is modulated such that its absolute capacitance to ground is measured at the same time that the transcapacitive coupling between the first sensor electrode and proximate sensor electrodes is measured. For example, sensor electrode $X_1$ may be modulated to measure its absolute capacitance $C_{X1F1}$ and to measure the transcapacitive couplings $C_{X1Y1}$, $C_{X1Y5}$, $C_{X1X2}$ and $C_{X1X3}$.

Indeed, various capacitive changes may be correlated differently depending on how well input object(s) is/are coupled to system ground. For example, relatively uncoupled inputs (e.g., from different users) can be separately identified by their intra-set transcapacitive capacitance matrices. In such an example, a first user may be holding the input device while a second user is not; however, other orientations are also possible. The intra-set transcapacitive capacitance effects between separated electrodes is usually also very small so that even in an unknown startup condition a large intra-set transcapacitance between separated sensor electrodes almost certainly indicates a floating conductive object (e.g., moisture, a coin, etc.) that might be ignored and that its effect (e.g., on delta set-to-set transcapacitive) could be ignored when it is removed as well. Alternatively, effect may be estimated, and the estimate removed from data that is reported to a host processor and/or used to calculate reported user inputs. Note that scanning speed to reconstruct the relevant capacitances is taken into account through modeling; this is because any motion of an input object may change the correlated capacitances unless the motion of the input objects is modeled. In some embodiments, interleaved measurements of the capacitances when scanning may aid in reducing such "motion artifacts."

When using the techniques of combined capacitive sensing (described herein) to capture capacitances, the LGM effect can typically be modeled by a set of four capacitances from each input object to the sensor ($C_{X1F1}$, $C_{Y1F1}$, $C_{X1Y1}$, and $C_{FG}$) at each pixel/capacitive coupling that the input object covers. Most input objects are well coupled together (e.g., humans have ~150 pF to free space and ~75 pF series coupling to each other which easily dominate most other capacitive couplings to a sensor) so that the capacitance from a finger to ground ($C_{FG}$) may often be treated as a single variable mostly independent of the number of simultaneous input objects and nearby transcapacitive pixels/capacitive couplings (e.g., crossovers between electrode sets that are located on a neighboring electrode). Multi-input (e.g., multi-touch) interfaces with an input device are more complex, but these may still be modeled by additional capacitances (e.g., $C_{X4F1}$, $C_{X1F1}$, $C_{Y5F1}$, $C_{Y5F2}$, $C_{X4Y5}$). It is useful to measure at least one of the intra-set transcapacitances (e.g., $C_{X1X4}$ and $C_{Y5Y1}$) in addition to the absolute capacitances such that cross capacitive effects can be detected independently and corrected. Note that for each user input there are three changes in capacitance which are of great interest (the delta capacitance from the X electrodes to the finger, $dC_{XF}$; the delta capacitance from the Y electrodes to the finger, $dC_{YF}$; and the delta capacitance from a transmitting sensor electrode to a receiving sensor electrode, $dC_{TR}$) for each input capacitive pixel and one uncontrolled capacitance $C_{FG}$ associated with the coupling of an input object to the chassis. It should be noted that each additional input capacitive pixel coupling adds three more of these capacitances of interest.

The charge coupling that can be measured (e.g., by a capacitive sensor array such as sensor electrode pattern 200) includes up to 5 capacitive measurements if multiple pixels are covered. Also for a particular sensor design the ratio of $C_{XF}$ and $C_{YF}$ to $C_{XY}$ can be correlated with a particular $C_{FG}$ and/or coupling between inputs (e.g., for a fully covered capacitive pixel, with a given electrode configuration there is an expected ratio between $dC_{XY}$, $dC_{XF}$, and $dC_{YF}$ for a given $C_{FG}$). Using such correlations between capacitive measurements images of $C_{YS}$ and profiles of $C_{XF}$ and $C_{YF}$ can be reconstructed (e.g., errors due to $C_{FG}$ may be estimated and/or corrected for) in a way that is roughly independent of $C_{FG}$ (e.g., as if the input is effectively grounded), and/or each input object may be classified by its chassis coupling (e.g., as a floating or grounded object). It is often preferred that "un-grounded" objects are ignored (e.g., water droplets, or coins) while even partially grounded objects (e.g., small fingers) are accurately detected even when they are only partially coupled to the chassis of the sensor. Although, in some embodiments, sensor electrode B may be modulated to estimate the capacitive coupling between sensor electrode B and system ground.

One method of detecting each of the capacitances within the full P matrix is "one hot" scanning where each of the sensor electrodes is modulated in sequence while the others are held relatively stationary (such as at ground, or some fixed or commonly modulated voltage potential). In one implementation the modulated sensor electrode absolute/self capacitance (e.g., coupling to the chassis) may be simultaneously measured such that all electrodes are used as receivers. In this way part, or the entire matrix of capacitances may be measured or scanned independently (although the charge coupling through $C_{FG}$ may require multiple measurements from separate pixels or some correlation dependent on sensor design). In various embodiments, each sensor electrode that is scanned measures one row of array 400 of FIG. 4 while each column represents the measurement by a sensor electrode. By measuring the transcapacitance matrix by scanning electrodes in sequence from the crossing set of electrodes the reduced charge coupling seen when multiple (or long and narrow) objects are placed on a single transmitting electrode since an orthogonal set of electrodes will only overlap the long object at a single location.

In some embodiments, different sensing schemes other than "one hot" scanning can be done to increase the power in various measurements, reduce interference and/or and increase the acquisition rate. For increased signal and interference tolerance each sensor may be modulated as often as possible, in some embodiments. There are possible dynamic range issues if the coupling between adjacent or overlapping sensor electrodes is particularly high, but there are also opportunities to reduce the charge coupled dynamic range. For example, in some embodiments, some sensor electrodes such as sensor electrodes Y may be longer and or wider, and thus these sensor electrodes may have more $C_G$ back coupled ground capacitance, which limits their dynamic range. In such a case, neighboring electrodes (e.g., $X_1$ and $X_3$) may not be measured when $X_2$ is modulated relative to them. Similarly, in some embodiments, some sensor electrodes such as sensor electrodes X may be shorter and/or narrower, and may be driven to "guard" the others of the sensor electrodes X that are used for transmitting. In various embodiments, only a subset of the simultaneous capacitive measurements may be acquired by the processing system 110. In such embodiments, processing system 110 may only use those sensor electrodes configured to provide the least dynamic range. For example, measured receiver electrodes may be narrower or shorter than modulated transmitter or guarding electrodes, and the receiver electrodes may be spaced (due to their narrowness) at a larger distance to each other. Further, the guarding electrodes may be disposed between the receiver sensor electrode them to reduce their intra group transcapacitive coupling dynamic range. In some embodiments, some sensor electrodes that transmit can further reduce the required dynamic range by transitioning farther than the other sensor electrodes (e.g., by being driven with a modulated signal having greater amplitude but being in phase with) and thus subtracting charge that would otherwise need to be supplied by the receivers that are coupled with receiver sensor electrodes to maintain the voltage relative to system ground when the transmitter electrode is modulated. In other embodiments, coded sequences which minimize dynamic range while optimizing independence of measurements and sensing SNR may be used.

Both (or only one) of the sensor electrodes X and the sensor electrodes Y can still be measuring absolute capacitance profiles while transmitting or receiving. In one embodiment, Y may be the preferred shorter and/or narrower and more widely spaced electrodes with X filling space between. For scanning, one or more of the sensor electrodes Y can transition the opposite direction (e.g., 180 degrees out of phase). By swinging in opposite direction from the electrodes X, this increases the voltage difference between the orthogonal sensor electrode sets and thus the Signal to Noise Ratio (SNR) and interference performance of set-to-set transcapacitance, as well as the interference performance of any intra-set transcapacitance measurements within either set. Note, in some embodiments, that if all of the sensor electrodes but the scanning sensor electrode are modulated together, they may be measuring absolute capacitance and guarding all other similarly driven electrodes, while only the single scanning electrode may be used to measure transcapacitance between sensor electrodes. Multiple sensor electrodes can also be driven in coded sequences to improve SNR. Where absolute measurements are mixed with the result of other measurements may be interleaved to reduce the effect of temporal variation.

In one embodiment, all of the sensor electrodes in a sensor electrode array (e.g., sensor electrode pattern 200) are modulated in phase. In various embodiments, the amplitudes may vary between axes for the previously mentioned charge subtraction effects to balance the required dynamic range required of the different chassis couplings of X and Y sensor electrode sets). This allows a measurement of the P absolute capacitive measurements (mixed with some transcapacitance if they are not modulated with the same amplitude). This can facilitate detecting inputs at longer distances with lower power for "proximity" and "doze" modes. Then, while almost all of the electrodes are still modulated in phase, a single sensor electrode (or a single sensor electrode on each axis) may be modulated in the opposite phase to independently measure the set-to-set transcapacitive matrix (M*N) and the intra-set transcapacitive capacitive matrix (e.g., M*M or N*N). In one embodiment, neighboring intra-set transcapacitively coupled sensor electrodes may have reduced modulation (e.g., stationary voltage relative to system ground) to reduce the required dynamic range. Once all of the sensor electrodes significantly affected by user input are modulated, then enough measurements of charge coupling have been made to distinguish and independently reconstruct grounded, partially grounded, and effectively un-grounded conductive (or high dielectric) objects influencing the input device. These reconstructed images, profiles, and distinguished input types may be used to control user input (e.g., on a touch screen user interface/operating system).

Furthermore, capturing active pen signals (e.g., another transmitter outside the sensor array) can be done in half the time or with half the bandwidth when both axes of sensor electrodes (e.g., sensor electrodes X and sensor electrodes Y) are sensing simultaneously since both profiles can be captured simultaneously. If multiple independent measurements of these profiles are made, then the active input can be further distinguished from the other two types. In this way an additional type of input can be measured substantially simultaneously.

For low voltage high dynamic range receivers, in some embodiments, a "current conveyor" technique may be used to translate the received charge from a receiving sensor electrode. In order to measure absolute/self capacitance a sensor electrode is modulated between at least two voltages. Doing this with a single circuit configuration may impose restrictions on the size of the voltage change (e.g., how close to a particular high or low voltage rail) due to the type of transistor (e.g., n or p channel Field Effect Transistors (FETs)). In one embodiment, to avoid this issue, two current conveyors optimized for different reference voltages with a sensor electrode switched between them may be used. The current conveyors accumulate charge on at least two capacitors for measuring differential or quadrature capacitances (e.g., two or alternately three or four capacitors may be used). This allows for modulating the sensor electrodes near the voltage rails without significantly changing voltages (and charging internal capacitances) on internal nodes of a current conveyor more than is necessary for sensing charge coupled from the sensor electrodes.

Example Processing System

Figure 5:
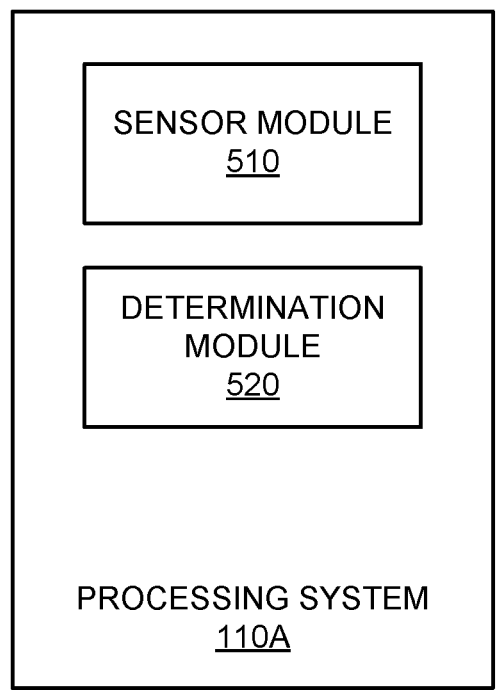
FIG. 5 shows a block diagram of an example processing system, according to an embodiment.

FIG. 5 shows a block diagram of an example processing system 110A, according to an embodiment. Processing system 110A may be utilized with an input device (e.g., in place of processing system 110 as part of input device 100), according to various embodiments. Processing system 110A may be implemented with one or more Application Specific Integrated Circuits (ASICSs), one or more Integrated Circuits (ICs), one or more controllers, or some combination thereof. In one embodiment, processing system 110A is communicatively coupled with a plurality of sensor electrodes that implement a sensing region 120 of an input device 100. In some embodiments, processing system 110A and the input device 100, of which it is a part, may be disposed in or communicatively coupled with an electronic system 150, such as a display device, computer, or other electronic system. Reference will be made to sensor electrode pattern 200 of FIG. 2A and to one or more of FIGS. 6A, 6B, 6C and 6D in describing example operations of processing system 100A.

In one embodiment, processing system 110A includes, among other components: sensor module 510, and determination module 520. Processing system 110A and/or components thereof may be coupled with sensor electrodes of a pattern of sensor electrodes, such as sensor electrode pattern 200 or 210, among others. For example, sensor module 510 is coupled with one or more sensor electrodes (Y, X) of a sensor electrode pattern (e.g., sensor electrode pattern 200) of input device 100.

Sensor module 510 comprises sensing circuitry that is coupled to sensor electrodes of a sensor electrode pattern, such as via routing. Sensor circuitry of sensor module 510 may include logic and, in many embodiments, the sensor circuitry includes one or more amplifiers and associated circuitry used for transmitting and receiving signals. Such an amplifier may be interchangeably referred to as an "amplifier," a "front-end amplifier," a "receiver," an "integrating amplifier," a "differential amplifier," "transimpedance amplifier", or the like, and operates, in some embodiments, to receive a resulting signal (e.g., the resulting signal may be a current signal) at an input and provide a proportional charge which may be output as an integrated voltage. In one or more embodiments, the sensor module 510 maintains a low impedance input when measuring input current or charge. In some embodiments, sensor module 510 may also operate the same or a different amplifier to drive (or modulate) a transmitter signal onto a sensor electrode. The resulting signal is from one or more sensor electrodes of a sensor electrode pattern, such as sensor electrode pattern 200, and comprises effects that result from a transmitter signal that has been driven onto the sensor electrode or onto another sensor electrode of the sensor electrode pattern or effects corresponding to an input object proximate the sensor electrode pattern to which sensor module 510 is coupled. In some embodiments, a single amplifier may be coupled with and used to receive a resulting signal from exclusively from a single sensor electrode. In such embodiments, there would be at least one amplifier for each sensor electrode in a sensor electrode pattern from which a signal is received. For example, in some embodiments, a first amplifier may be coupled with a first sensor electrode while a second amplifier is coupled with a second sensor electrode, and etc. for the number of sensor electrodes from which signals are received by sensor module 510. In other embodiments, multiple resulting signals from different sensor electrodes may be summed by sensor module 510. For example, sensor electrodes may be coupled to different ones of multiple current conveyors whose output may summed into a single amplifier. In yet other embodiments, multiple sensor electrodes may be coupled to a common amplifier through a multiplexer. The multiplexer may select one sensor electrode at a time or multiple sensor electrodes at a time. Furthermore, a multiplexer may allow for sensor electrodes to be connected to different receivers or with different polarities or phases to the same receiver.

Sensor module 510 operates to interact with the sensor electrodes of a sensor electrode pattern, such as sensor electrode pattern 200, that are utilized to generate a sensing region 120. This includes operating one or more sensor electrodes Y to be silent (e.g., not modulated relative to other sensor electrodes), to be driven with a transmitter signal, to be used for transcapacitive sensing (intra-set or set-to-set), and/or to be used for absolute capacitive sensing. This also includes operating one or more sensor electrodes X to be silent, to be driven with a transmitter signal, to be used for transcapacitive sensing (intra-set or set-to-set), and/or to be used for absolute capacitive sensing.

During transcapacitive sensing, sensor module 510 operates to drive a transmitter signals on one or more sensor electrodes of a set of sensor electrodes (e.g., one or more of sensor electrodes Y and/or one or more of sensor electrodes X). A transmitter signal may be a square wave, trapezoidal wave, sine wave, or some other modulated signal. In a given time interval, sensor module 510 may drive or not drive a transmitter signal (waveform) on one or more of the plurality of sensor electrodes of the sensor electrodes to which it is coupled. Sensor module 510 may also be utilized to couple one or more of the non-driven sensor electrodes to high impedance, ground, or a constant voltage potential, or a modulated voltage when not driving a transmitter signal on such sensor electrodes. In some embodiments, when performing transcapacitive sensing, sensor module 510 drives two or more transmitter electrodes of a sensor electrode pattern at one time. When driving two or more sensor electrodes of a sensor electrode pattern at once, the transmitter signals may be coded according to a coding scheme. The coded transmitter signals may comprise a varying phase, frequency and/or amplitude. In various embodiments, the coding scheme may be at least substantially orthogonal. Further, the code(s) used may be altered, such as by lengthening or shortening a code to avoid or resist interference. In some embodiments, sensor module 510 is configured to drive multiple sensor electrodes transmitter signals, where each of the multiple sensor electrodes are each driven with a different transmitter signal and where the transmitter signals are each coded according to a coding scheme. In such embodiments, the sensor electrodes may be simultaneously driven. Sensor module 510 also operates to receive resulting signals, via a second plurality of sensor electrodes during transcapacitive sensing. During transcapacitive sensing, received resulting signals correspond to and include effects corresponding to the transmitter signal(s) transmitted via sensor electrodes that are driven with transmitter signals. These transmitted transmitter signals may be altered or changed in the resulting signal at the receiver due to presence of an input object, stray capacitance, noise, interference, and/or circuit imperfections among other factors, and thus may differ slightly or greatly from their transmitted versions.

In absolute capacitive sensing, sensor module 510 both drives a sensor electrode relative to system ground or an input object and uses that driven sensor electrode to receive a resulting signal that results from at least the signal driven on to the sensor electrode. In this manner, during absolute capacitive sensing, sensor module 510 operates to drive a signal on to and receive a signal from one or more of sensor electrodes Y or X. During absolute capacitive sensing, the driven signal may be referred to as an absolute capacitive sensing signal, transmitter signal, or modulated signal, and it is driven through a routing trace that provides a communicative coupling between processing system 110A and the sensor electrode(s) with which absolute capacitive sensing is being conducted. It should be appreciated that the transmitter signal driven onto a particular sensor electrode for transcapacitive sensing and the transmitter signal driven on to that same particular electrode for absolute capacitive sensing may be similar or identical.

In combined capacitive sensing, sensor module 510 may operate to drive a modulated transmitter signal on one sensor electrode of a sensor electrode pattern while receiving resulting signals (which comprise effects that result from the transmitter signal) on at least one and up to all other sensor electrodes of the sensor electrode pattern, and while simultaneously also using the modulated transmitter signal to charge and then receive resulting signals from the driven sensor electrode for measuring absolute capacitance with that sensor electrode. That is, sensor module 510 may operate to both drive and receive signals in a manner that facilitates simultaneous absolute capacitive sensing and transcapacitive sensing. It should be appreciated that, when performing combined capacitive sensing, sensor module 510 may drive transmitter signals on more than one sensor electrode either concurrently or at different times. Further, processing system 110 may be configured to receive resulting signals corresponding to an absolute capacitive coupling on more than one sensor electrode either concurrently or at different times. As described earlier, the transmitter signal may be substantially orthogonal, such that they are orthogonal in time, code, frequency, etc.

Determination module 520 may be implemented as hardware (e.g., hardware logic and/or other circuitry) and/or as a combination of hardware and instructions stored in a non-transitory manner in a computer readable storage medium.

In embodiments where transcapacitive sensing is performed, determination module 520 operates to compute/determine a measurement of a change in a transcapacitive capacitive coupling between a first and second sensor electrode during transcapacitive sensing. Determination module 520 then uses such measurements to determine the positional information comprising the position of an input object (if any) with respect to sensing region 120. With reference to FIG. 2A, by way of example, the positional information can be determined from a capacitive image formed of capacitive couplings/pixels like 290, a capacitive profile (transcapacitive or absolute capacitive) formed from capacitive couplings/pixels like 295, 297, and/or 299, or some combination thereof. With reference to FIG. 2B, the position information can be determined from a capacitive image or profile formed of capacitive couplings/pixels like 280, 281, 282, 283, and/or 284, or some combination thereof. In some embodiments, multiple capacitive images/profiles may be combined, correlated, and/or compared to determine position information. The capacitive image(s)/profile(s) is/are determined by determination module 520 based upon resulting signals acquired by sensor module 510. It is appreciated that, when applicable, determination module 520 operates to decode and reassemble coded resulting signals to construct capacitive image(s)/profiles(s) from one or more transcapacitive scan of a plurality of sensor electrodes.

In embodiments where absolute capacitive sensing is performed with sensor electrodes Y and/or X, determination module 520 also operates to compute/determine a measurement of absolute capacitive coupling (also referred to as background capacitance, $C_B$) to a sensor electrode which may be used to form a baseline. When an input object is within a sensing region, this comprises additionally comprises a measuring of absolute capacitance between the driven sensor electrode(s) and the input object which may change the total absolute capacitance relative to the baseline. With respect to the techniques described herein, determination module 520 operates to determine an absolute capacitance of the sensor electrode (e.g., sensor electrode X1) after an absolute capacitive sensing signal has been driven on the sensor electrode. Determination module 520 operates to construct capacitive profiles from a plurality of absolute capacitance measurements on an axis. For example, in an embodiment where absolute capacitances are measured on individual sensor electrodes X of sensor electrode pattern 200, determination module 520 determines and constructs a first capacitive profile from these absolute capacitive measurements. Similarly, in an embodiment where absolute capacitances are measured on individual sensor electrodes Y of sensor electrode pattern 200, determination module 520 determines and constructs a second capacitive profile from these absolute capacitive measurements. In various embodiments, peaks in the measured response or significant changes in curvature of the measurements relative to a baseline may be used to identify the location of input objects.

In embodiments where combined capacitive sensing is performed with a sensor electrode pattern and produces resulting signals associated with both absolute capacitive measurements and transcapacitive measurements, determination module 520 operates to determine capacitive images, transcapacitive profiles, and/or absolute capacitive profiles from the received resulting signals and can also combine, correlate, and/or compare images, profiles, and/or individual capacitances determined from resulting signals in order to determine position information of any input objects in a sensing region of the sensor electrode pattern. In some embodiments, determination module 520 combines, correlates, and/or compares these various measurements, profiles, and images, to determine positional information with respect to an input object and/or to determine instances when low ground mass effect ($C_{XF}$ or $C_{YF}$ is substantially equal to $C_{FG}$) may make it seem as if an input object is present (e.g., in a capacitive image) but is not (because it does not also exist a profile). Alternately, in various embodiments, where an object appears significant in an intra-axis transcapacitive profile, but does not appear in the absolute profile, then the object may also be ignored and not reported or absorbed into an image baseline (e.g., it may be a coin or water droplet).

In some embodiments, processing system 110A comprises decision making logic which directs one or more portions of processing system 110A, such as sensor module 510 and/or determination module 520, to operate in a selected one of a plurality of different operating modes based on various inputs.

Processing System Operation

Several examples will now be discussed to illustrate, in part, the operations of processing system 110A. Reference will be made to sensor electrode pattern 200 of FIG. 2A in the description of these examples. In these, examples and elsewhere herein, it should be appreciated that two sets of substantially orthogonal sensor electrodes (e.g., sensor electrodes X and sensor electrodes Y of sensor electrode pattern 200) are often described. It should be appreciated that the substantially orthogonal sets of sensor electrodes may be disposed in entirely different layers from one another in the sensor electrode pattern, partially in the same layer as one another in the sensor electrode pattern, or entirely in the same common layer as one another in the sensor electrode pattern (e.g., a single layer sensor electrode pattern). Further with reference to FIG. 2B, the sensor electrodes may be disposed in a matrix (regular or irregular) pattern. In such an embodiment, the sensor electrodes may comprise a similar shape and/or size. Further, the sensor electrode may cover substantially the entire sensing area (e.g., with very small non-overlapping gaps). Routing traces coupled to the sensor electrodes may be disposed on a common layer to sensor electrodes or on a different layer. The sensor electrodes or grid electrodes between the sensor electrodes may substantially shield the routing traces from the effect of user inputs. Further, the routing traces may be comprised of a common material to the sensor electrodes or a different material. Further still, while not illustrated, one or more grid electrodes may be disposed between the sensor electrodes.

Consider an example where sensor electrode X1 of sensor electrode pattern 200 is driven by sensor module 510 with a modulated transmitter signal. In such an embodiment, first resulting signals (used for absolute capacitive measurement) may be received from sensor electrode X1 while second, third, fourth, etc. resulting signals (comprising effects of the modulated transmitter signal and used for transcapacitive measurement) are simultaneously received from one or more other sensor electrodes (e.g., X2, X3, X4, Y1, Y2, Y3, Y4, and Y5) of the sensor electrode pattern 200. For example, resulting signals may be received simultaneously on up to all of sensor electrodes X2, X3, X4, Y1, Y2, Y3, Y4, and Y5. In some embodiments, processing system 110A (e.g., sensor module 510) may drive a guarding signal on a sensor electrode that is proximate the sensor electrode being driven with the transmitter signal; the guarding signal may be in-phase with the transmitter signal. For example, if a modulated transmitter signal is driven on sensor electrode X1, a guarding signal may be driven on sensor electrode X2 at the same or at different amplitude that the modulated transmitter signal. In such a case, resulting signals may not be received from the sensor electrode that is used for guarding. In one specific embodiment, the guarding signal is in phase with and comprises the same amplitude as the transmitter signal. Further, in some embodiments, the sensor electrode driven with the guard signal may be used to measure a capacitance to system ground.

Determination module 520 then determines a capacitive coupling (e.g., an absolute capacitance) between an input object and the first sensor electrode, e.g., X1, based on the first resulting signals and a change in capacitive coupling between the first and second sensor electrodes based on the second resulting signals. In an embodiment where the second sensor electrode is X2 a change in capacitive coupling between sensor electrode X1 and sensor electrode X2 is determined; if the second sensor electrode is Y5 the change in capacitive coupling between sensor electrode X1 and sensor electrode Y5 is determined.

In some embodiments, sensor module 510 drives a modulated signal on one sensor electrode of a sensor electrode pattern and concurrently drives a second modulated transmitter signal on a second sensor electrode of the sensor electrode pattern. In one such embodiment, the second modulated signal may have a phase opposite that of the modulated signal. For example, in one embodiment, when sensor module 510 drives a modulated transmitter signal on sensor electrode X1 of sensor electrode pattern 200, sensor module 510 also drives a second transmitter signal (e.g., having opposite phase of the transmitter signal) onto sensor electrode Y5. When sensor module 510 receives resulting signals from sensor electrodes other than those being driven (e.g., sensor electrodes X2, X3, X4, Y2, Y3, Y4, and Y5) the resulting signals comprise effects from both the modulated transmitter signal and the second modulated transmitter signal. Alternatively, sensor electrodes $X_1$ and $Y_1$ may be driven with signals being based on different codes or frequencies. In various embodiments, while sensor electrode $Y_5$ is modulated relative to system ground the one or more other sensor electrodes may not be modulated relative to system ground. In such embodiments, sensor electrode $Y_5$ may be configured to receive a resulting signal that may be used to determine a measure of the change in absolute capacitance of sensor electrode $Y_5$ and changes in transcapacitances between sensor electrode $Y_5$ and other sensor electrodes. By also driving sensor electrode $X_1$ with a transmitter signal having an opposite phase, the change in transcapacitance between $Y_5$ and $X_1$ may be larger than the change between $Y_5$ and other sensor electrodes. In some embodiments, this change may be almost twice as large.

In some embodiments, when a "one hot" technique is employed, after a modulated signal is driven on a first electrode sensor module 510 drives a second modulated signal on a second and different sensor electrode. For example, if the modulated signal was driven on sensor electrode X1 of sensor electrode pattern 200, first resulting signals could be received from sensor electrode X1, while second resulting signals are received from sensor electrode X2 and third resulting signals are received from sensor electrode Y5. At a time after the first modulated signal has been driven (e.g., not concurrent with) a second modulated signal is driven. The second modulated signal is not driven on sensor electrode X1, but instead on another of the sensor electrodes (e.g., X2, X3, X4, Y1, Y2, Y3, Y4, or Y5). Resulting signals, used for absolute capacitive sensing can then be received on the driven sensor electrode while simultaneously receiving resulting signals (comprising effects of the second modulated signals and used for transcapacitive sensing) from any one or more of the non-driven sensor electrodes. For example, the second modulated signal can be driven on sensor electrode X2 and fourth resulting signals for absolute capacitive sensing can be received from sensor electrode X2 while simultaneously receiving fifth and sixth resulting signals for transcapacitive sensing from sensor electrodes X1 and Y5. Alternatively, in another example, the second modulated signal can be driven on sensor electrode Y5 and fourth resulting signals for absolute capacitive sensing can be received from sensor electrode Y5 while simultaneously receiving fifth and sixth resulting signals for transcapacitive sensing from sensor electrodes X1 and X2. Then, based at least on the first, second, third, fourth, fifth and sixth resulting signals, determination module 520 determines a first set-to-set capacitive image along a first axis (e.g., an axis associated with the X sensor electrodes), a second set-to-set capacitive image along a second axis (e.g., an axis associated with the Y sensor electrodes), an absolute capacitive profile along the first axis, an absolute capacitive profile along the second axis, a transcapacitive profile along the first axis (e.g., an intra-set transcapacitive profile of the X electrodes), and a transcapacitive profile along the second axis (e.g., an intra-set transcapacitive profile of the Y electrodes).

Referring now to FIGS. 6A-6D, it should be appreciated that FIGS. 6A, 6B, 6C, and 6D only illustrate sensor electrodes of sensor electrode pattern 200 and eliminate depiction of insulating layers, substrates, routing traces, and the like to more clearly depict capacitances measured in various embodiments. Additionally, in FIGS. 6A-6D, for convenience of labeling capacitances, input object 140 is also represented by a legend of F1 for "Finger 1." It should be appreciated that the description and techniques presented with respect to FIGS. 6A-6D may similarly be applied to the sensor electrode pattern 210 of FIG. 2B.

Figure 6A:
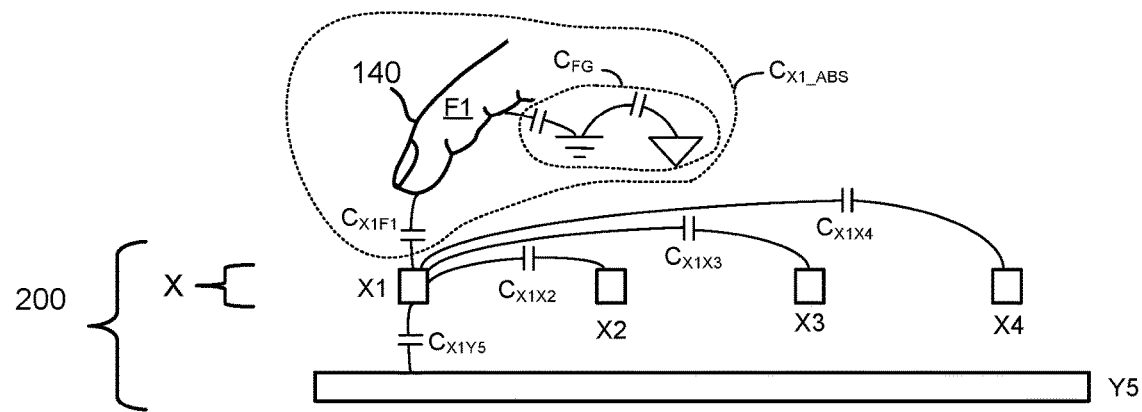
FIG. 6A shows an exploded front side elevation of the example sensor electrode pattern of FIG. 2A with labeled capacitances, according to an embodiment.

FIG. 6A shows an exploded front side elevation 610 of the example sensor electrode pattern 200 of FIG. 2A with labeled capacitances, according to an embodiment. In FIG. 6A, in one embodiment, sensor module 510 drives only sensor electrode X1 with a modulated transmitter signal. This is an example of the "one hot" technique that has been previously mentioned. Sensor module 510 receives resulting signals from sensor electrodes X1, X2, X3, X4, and Y5 which respectively allow determination module 520 to determine capacitances $C_{X1\_ABS}$ (a combination of $C_{X1F1}$ and $C_{FG}$), $C_{X1X2}$, $C_{X1X3}$, $C_{X1X4}$ and $C_{X1Y5}$. This allows the sensor module to determine the measurements substantially independently. Further, $C_{X1F1}$ may be relatively stationary during measurements. $C_{X1F1}$ allows for the coupling $C_{X1}$ to ground of finger freespace to be determined. Further, while not illustrated, a capacitance coupling exists between sensor electrode X1 and system ground (electrode G in FIG. 3A) and possibly other electrodes not shown, and depending on their relative voltage modulation (e.g. grounded or transmitting an opposite polarity but not guarding X1), they may be included in a measurement of charge through X1 and affect measurement of $C_{X1\_ABS}$.

Figure 6B:
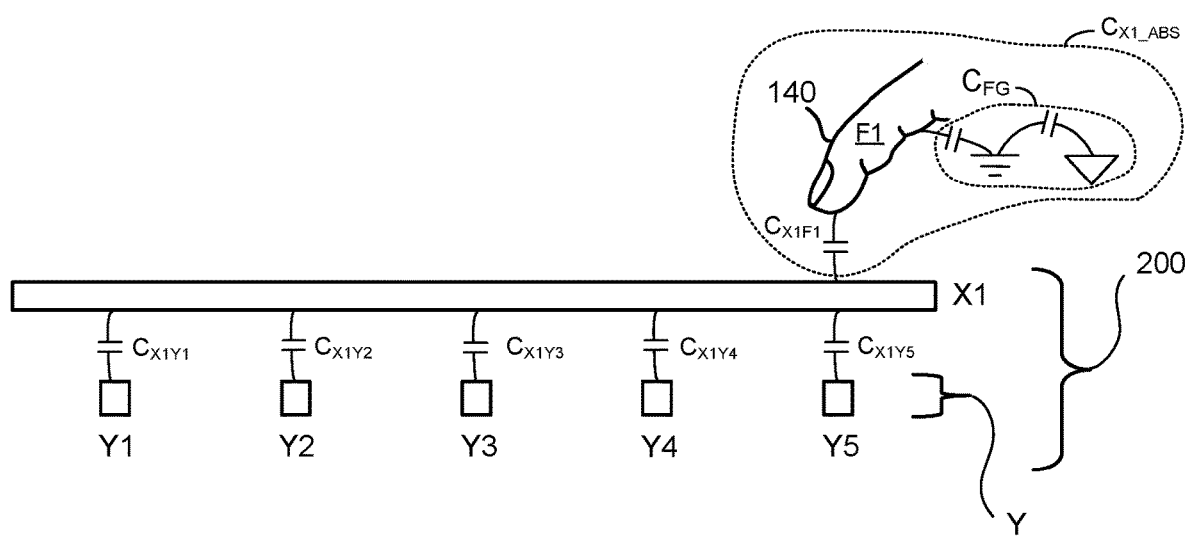
FIG. 6B shows an exploded left side elevation of the example sensor electrode pattern of FIG. 2A with labeled capacitances, according to an embodiment.

FIG. 6B shows an exploded left side elevation 620 of the example sensor electrode pattern 200 of FIG. 2A with labeled capacitances, according to an embodiment. FIG. 6B continues the example illustrated in FIG. 6A and shows that when sensor electrode X1 is driven with a modulated transmitter signal sensor module 510 also receives resulting signals from sensor electrodes Y1, Y2, Y3, and Y4, which respectively allow determination module 520 to determine capacitances $C_{X1Y1}$, $C_{X1Y2}$, $C_{X1Y3}$, and $C_{X1Y4}$. Following this one hot technique, other X electrodes can be driven in-turn, and resulting signals can be received in a similar fashion.

Figure 6C:
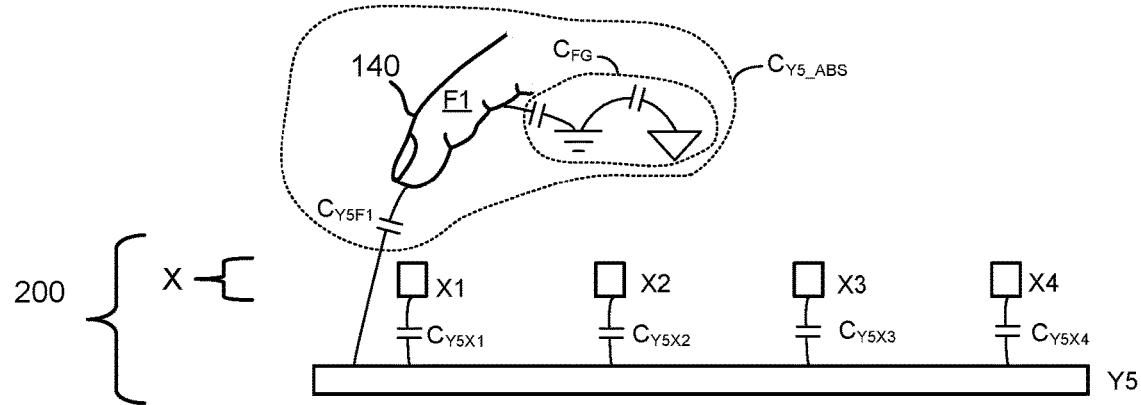
FIG. 6C shows an exploded front side elevation of the example sensor electrode pattern of FIG. 2A with labeled capacitances, according to an embodiment.

FIG. 6C shows an exploded front side elevation 630 of the example sensor electrode pattern 200 of FIG. 2A with labeled capacitances, according to an embodiment. In FIG. 6C, in one embodiment, sensor module 510 drives only sensor electrode Y5 with a modulated transmitter signal. This is an example of the "one hot" technique that has been previously mentioned. Sensor module 510 receives resulting signals from sensor electrodes X1, X2, X3, X4, and Y5 which respectively allow determination module 520 to determine capacitances $C_{Y5X1}$, $C_{Y5X2}$, $C_{Y5X3}$, $C_{Y5X4}$ and $C_{Y5\_ABS}$ (a combination of $C_{Y5F1}$ and $C_{FG}$).

Figure 6D:
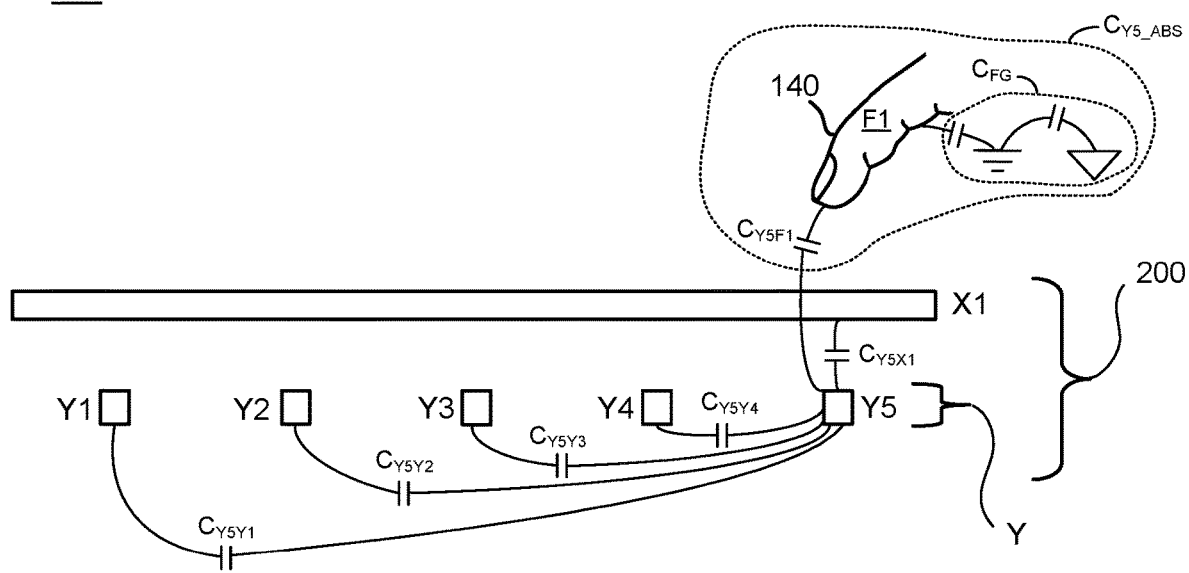
FIG. 6D shows an exploded left side elevation of the example sensor electrode pattern of FIG. 2A with labeled capacitances, according to an embodiment.

FIG. 6D shows an exploded left side elevation 640 of the example sensor electrode pattern 200 of FIG. 2A with labeled capacitances, according to an embodiment. FIG. 6D continues the example illustrated in FIG. 6C and shows that when sensor electrode Y5 is driven with a modulated transmitter signal sensor module 510 also receives resulting signals from sensor electrodes Y1, Y2, Y3, and Y4, which respectively allow determination module 520 to determine capacitances $C_{Y5Y1}$, $C_{Y5Y2}$, $C_{Y5Y3}$, and $C_{Y5Y4}$. Following this one hot technique, other Y electrodes can be driven in-turn, and resulting signals can be received in a similar fashion.

Example Methods of Operation

FIGS. 7A-7G illustrate a flow diagram 700 of various embodiments of a method of capacitive sensing. Procedures of embodiments of this method will be described with reference to elements and/or components of one or more of FIGS. 1-6D. It is appreciated that in some embodiments, the procedures may be performed in a different order than described, that some of the described procedures may not be performed, and/or that one or more additional procedures to those described may be performed. Likewise, it is appreciated that some procedures are carried out by components of processing system such as processing system 100A and/or stored instructions implemented by a processing system such as processing system 100A.

With reference to FIG. 7A, at procedure 701 of flow diagram 700, in one embodiment, a modulated signal is driven onto a first sensor electrode of a sensor electrode pattern. With respect to sensor electrode pattern 200, this can comprise driving a modulated transmitter signal onto any one of the sensor electrodes X or the sensor electrodes Y. For purposes of example, in one embodiment, this comprises processing system 110A (e.g., sensor module 510) driving a modulated transmitter signal onto sensor electrode X1 of sensor electrode pattern 200.

With continued reference to FIG. 7A, at procedure 702 of flow diagram 700, in one embodiment, first resulting signals are received from the first sensor electrode. Following the example started in procedure 701, if sensor electrode X1 is the first sensor electrode, then resulting signals are received from sensor electrode X1 by processing system 110A (e.g., by sensor module 510). The resulting signals may be used to determine a first charge measurement, $Q_{X1F1}$ (or more generally the series capacitance through $C_{X1ABS}$).

With continued reference to FIG. 7A, at procedure 703 of flow diagram 700, in one embodiment, second resulting signals are received from a second sensor electrode of the sensor electrode pattern. The second resulting signals comprise effects corresponding to the modulated signal; and the first resulting signals and the second resulting signals are simultaneously received. The second resulting signals may be used to determine a second charge measurement, $Q_{X1X2}$. Following the example of 701 and 702, in an embodiment where sensor electrode X1 is driven with a modulated transmitter signal, second resulting signals can be received by processing system 110A (e.g., by sensor module 510) from any of the remaining driven sensor electrodes of sensor electrode pattern 200. For example, in one embodiment, processing system 110A (e.g., sensor module 510) receives second resulting signals from sensor electrode X2. In another embodiment, for example, processing system 110A (e.g., sensor module 510) receives the second resulting signals from sensor electrode Y5. The second resulting signals may be used to determine a third charge measurement, $Q_{X1Y5}$.

With continued reference to FIG. 7A, at procedure 704 of flow diagram 700, in one embodiment, a capacitive coupling is determined between an input object and the first sensor electrode based on the first resulting signals and change in capacitive coupling between the first and second sensor electrodes based on the second resulting signals. With reference to the example described in procedure 703, processing system 110A (e.g., determination module 520) makes the determination of capacitive coupling in the manner previously described herein. For example, this can include utilizing, combining, correlating, and/or comparing one or more absolute capacitive profiles, one or more transcapacitive profiles, and one or more capacitive images which are determined from the resulting signals. For example, capacitance $C_{X1F1}$ may be determined based on $Qx_{1F1}$ and a first delta voltage and a capacitance $C_{X1X2}$ may be determined based on $Q_{X1X2}$ and a second delta voltage. The first delta voltage may be defined as a first voltage and system ground and the second delta voltage may be defined as the first voltage and a second voltage, where the second voltage may be ground.

With reference to FIG. 7B, as illustrated in procedure 705 of flow diagram 700, in some embodiments, the method as described in 701-704 further comprises driving a guarding signal is on a third sensor electrode of the sensor electrode pattern. The third sensor electrode is proximate the first sensor electrode and the guarding signal is in-phase with the modulated signal. In one embodiment, following the example discussed in procedures 701 where a modulated transmitter signal is driven on sensor electrode X1, a guard signal is driven by processing system 110A (e.g., sensor module 510) on sensor electrode X2. Sensor electrode X2 is proximate and immediately adjacent (no sensor electrodes between the two) to sensor electrode X1. Additionally, sensor electrodes X1 and X2 are in the set of sensor electrodes X that are oriented along a common axis with one another. In one embodiment, the guarding signal is the same modulated transmitter signal that is driven on sensor electrode X1. The guarding signal may be of lesser amplitude (i.e. underguarding), the same amplitude, or greater amplitude (i.e. overguarding) than the modulated transmitter signal driven on sensor electrode X1. In another example, if the modulated transmitter signal were being driven on sensor electrode Y3, a guarding signal could be driven on one or more of sensor electrodes Y2 and Y4.

With reference to FIG. 7C, as illustrated in procedure 706 of flow diagram 700, in some embodiments, the method as described in 701-704 further comprises driving a second modulated signal on the second sensor electrode, wherein the second modulated signal has a phase opposite that of the modulated signal, and wherein the modulated signal and the second modulated signal are driven concurrently. In one embodiment, this comprises driving the second modulated signal on a sensor electrode that is oriented along a different axis that the axis of orientation of the first sensor electrode. With reference to the example of procedures 701-704 where the first sensor electrode is sensor electrode X1, a second modulated transmitter signal that is 180 degrees out of phase (but otherwise the same) can be driven on sensor electrode Y5 (or any other sensor electrode Y). The phase difference means that the signal to noise ratio is increased (e.g., one sensor electrode is being driven with a high signal while the other is being driven with a low signal, and there is a difference in potential between the two that increases SNR). In such an embodiment, the previously discussed receipt of second resulting signals from the second sensor electrode of the sensor electrode pattern, now comprises: receiving the second resulting signals from the second sensor electrode of the sensor electrode pattern (e.g., by sensor module 510), where the second resulting signals comprise effects corresponding to the modulated signal driven on the first sensor electrode and the second modulated signal driven on the second sensor electrode.

Figure 7D:
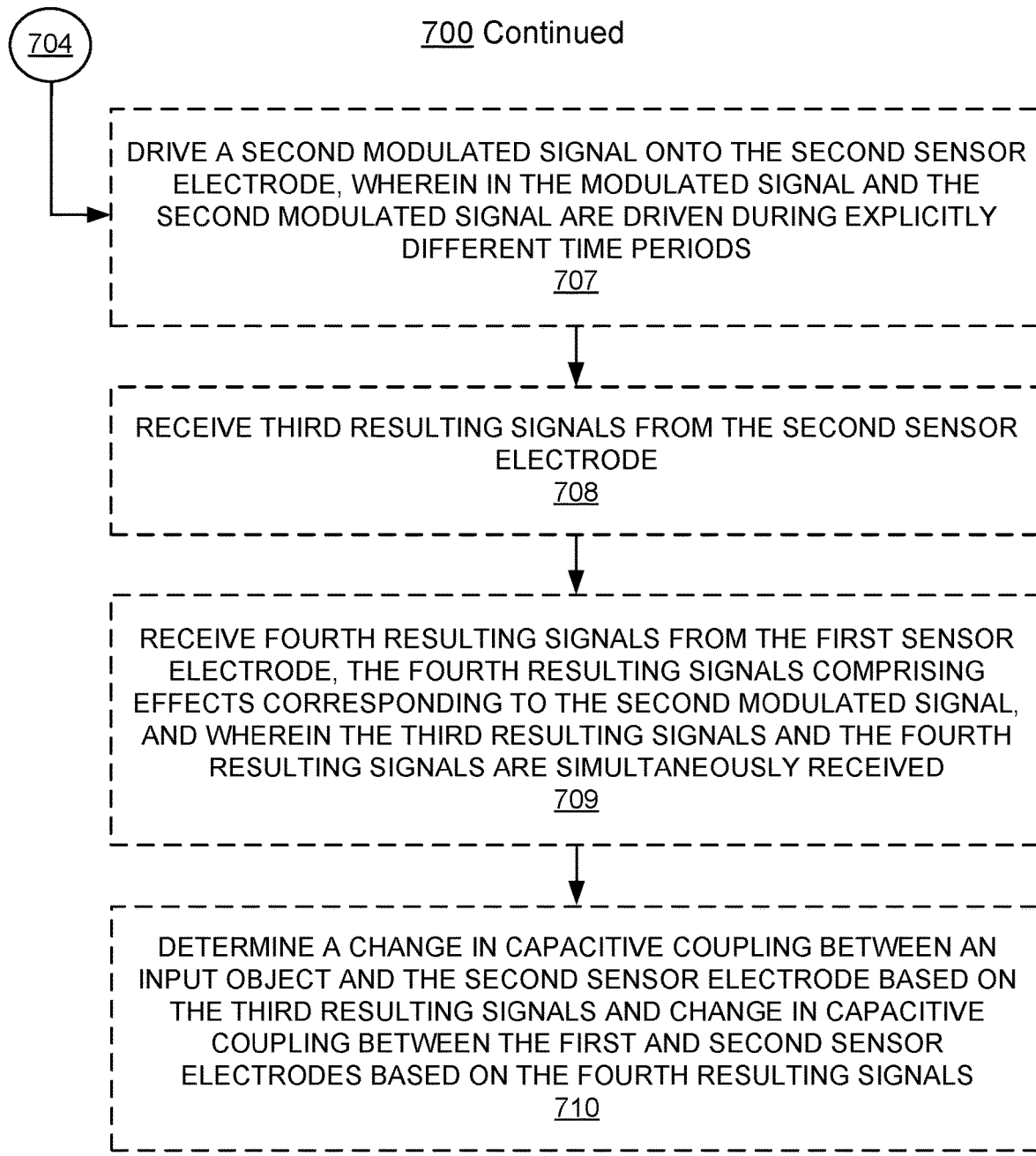

With reference to FIG. 7D, as illustrated in procedure 707 of flow diagram 700, in some embodiments, the method as described in 701-704 further comprises driving a second modulated signal onto the second sensor electrode of the sensor electrode pattern, where the modulated signal and the second modulated signal are driven during explicitly different time periods. For example, during the first time period the modulated signal may be driven on sensor electrode X1 as described in procedures 701-704; and during a second, different time period that does not overlap with the first time period, the modulated signal is driven by processing system 110A onto the second sensor electrode (e.g., onto sensor electrode X2 or sensor electrode Y5 in the previous example). In other embodiments, two or more modulated signals based on distant (and possible substantially orthogonal) codes can be driven onto different corresponding sensor electrodes. In such embodiments, each electrode may be decoded separately. In various embodiments, a first coding scheme may be used for absolute sensing a second and different coding scheme may be used for transcapacitive sensing. For example, Hadadmard codes may be used for absolute sensing while codes based on Linear Shift Registers may be used for transcapacitive sensing. Another method of simultaneously measuring independent capacitive couplings is to use substantially orthogonal frequencies such that an electrode (e.g., Y5) may be substantially guarding at one frequency (e.g. for a first absolute capacitive measurement by another electrode such as X1), while substantially stationary at another (e.g. for a second transcapacitive measurement by another electrode such as Y4), and even substantially opposite phase at a third frequency (e.g., for a third transcapacitive measurement by another electrode such as X2). Yet another method is to make independent capacitive measurements at different phases (e.g., 90 degrees for orthogonal sine and cosine modulations) such that measurements of absolute and transcapacitance can be made simultaneously.

With continued reference to FIG. 7D, at procedure 708 of flow diagram 700, the method as described in procedures 701-704 and 707 further comprises, receiving third resulting signals from the second sensor electrode. The third resulting signals are received from the second sensor electrode after being driven with the second modulated signal. Following the ongoing example, in an embodiment where sensor electrode X2 is the second sensor electrode, sensor module 510 receives the third resulting signals from it; and in an embodiment where sensor electrode Y5 is the second sensor electrode, sensor module 510 receives the second resulting signals from it.

With continued reference to FIG. 7D, at procedure 709 of flow diagram 700, the method as described in procedures 701-704, 707, and 708 further comprises, receiving fourth resulting signals from the first sensor electrode. The fourth resulting signals comprise effects corresponding to the second modulated signal, and the third resulting signals and the fourth resulting signals are simultaneously received. Following the ongoing example from procedures 701-704, the fourth resulting signals are received by sensor module 510 from sensor electrode X1.

With continued reference to FIG. 7D, at procedure 710 of flow diagram 700, the method as described in procedures 701-704, 707, 708, and 709 further comprises, determining a change in capacitive coupling between an input object and the second sensor electrode based on the third resulting signals and change in capacitive coupling between the first and second sensor electrodes based on the fourth resulting signals. In one embodiment, processing system 110A (e.g., determination module 520) makes the determination of capacitive coupling in the manner previously described herein. For example, this can include utilizing combining, correlating, and/or comparing more than one type of combined measurements of one or more absolute capacitive profiles, one or more transcapacitive profiles, and one or more capacitive images which are determined from the resulting signals. In embodiments where more than two voltages are modulated, charges are accumulated on the receivers which are a combination of polarized charge on modulated capacitors. However, by balancing multiple measurements, independent capacitive estimates may be made from a single combination signal.

Figure 7E:
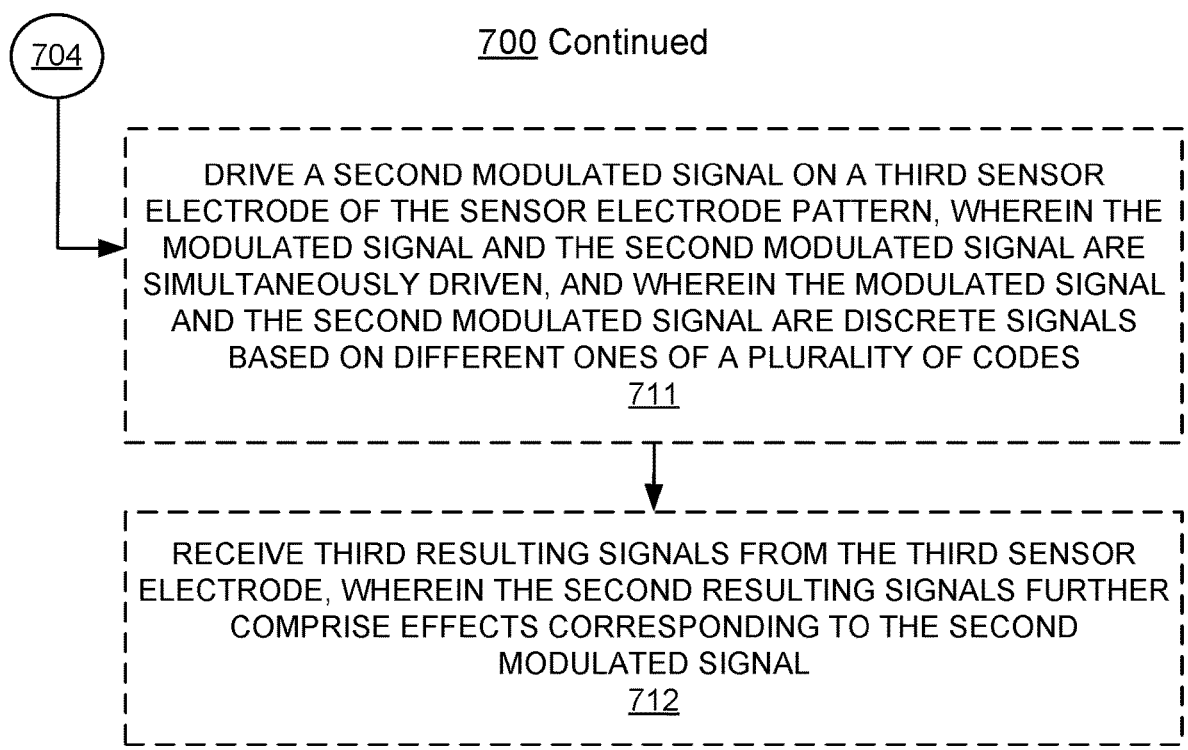

With reference to FIG. 7E, as illustrated in procedure 711 of flow diagram 700, in some embodiments, the method as described in 701-704 further comprises driving a second modulated signal on a third sensor electrode of the sensor electrode pattern. The modulated signal and the second modulated signal are simultaneously driven, and the modulated signal and the second modulated signal are discrete signals based on different ones of a plurality of codes. As with the first modulated signal, the second modulated signal is driven by processing system 110A (e.g., by sensor module 510). Consider example described in procedures 701-704, where sensor electrode X1 is the first sensor electrode. In one embodiment while the modulated signal is being driving on sensor electrode X1, a second modulated signal is driven on a different sensor electrode, such as sensor electrode X3 or sensor electrode Y2. A variety of coding schemes for simultaneously driving sensor electrodes are well known to those skilled in the arts of transcapacitive sensing, and many such coding schemes may be similarly applied to drive the modulated signal and the second modulated signal as signals coded differently from one another.

With continued reference to FIG. 7E, at procedure 712 of flow diagram 700, the method as described in procedures 701-704 and 711 further comprises, receiving third resulting signals from the third sensor electrode that has been driven with the second modulated signal. Processing system 110A (e.g., sensor module 510) can receive the third resulting signals. Due to two differently coded modulated signals being driven simultaneously, the previously described second resulting signals will further comprise effects corresponding to the second modulated signal as well as effects corresponding to the modulated signal.

With reference to FIG. 7F, as illustrated in procedure 713 of flow diagram 700, in some embodiments, the method as described in 701-704 further comprises receiving third resulting signals with a third sensor electrode of the sensor electrode pattern, where the third resulting signals are received simultaneously with the first and second resulting signals. Consider the example described in procedures 701 and 704, in one embodiment, third resulting signals are received from sensor electrode X3, fourth resulting signals from sensor electrode X4, fifth resulting signals from sensor electrode Y4, sixth resulting signals from sensor electrode Y3, seventh resulting signals from sensor electrode Y2, and eighth resulting signals from sensor electrode Y1. Each of the third through eighth resulting signals comprises effects from the modulated signal driven on sensor electrode X1. All of these resulting signals can be utilized by processing system 110A (e.g., by determination module 520) to determine the position of an input object with respect to sensor electrode pattern 200.

Figure 7G:
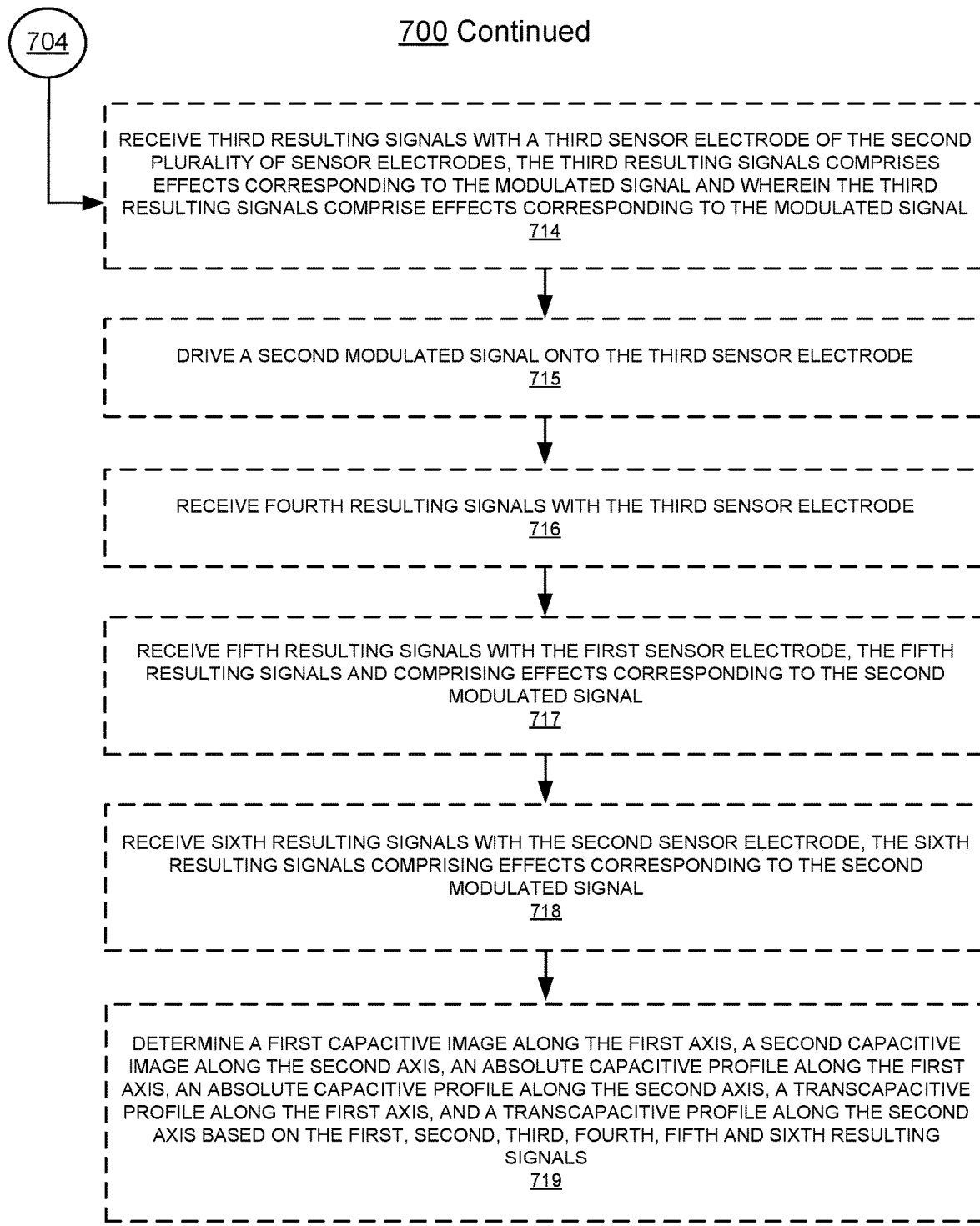

With reference to FIG. 7G, as illustrated in procedure 714 of flow diagram 700, in some embodiments, the method as described in 701-704 utilized a sensor electrode pattern that comprises a first plurality of sensor electrodes disposed along a first axis (e.g., the axis of the long edge of each sensor electrodes X) and a second plurality of sensor electrode disposed along a second axis (e.g., the axis of the long edge of each of the sensor electrodes Y), where the first axis is substantially orthogonal to the second axis and where the first plurality of sensor electrodes comprises the first and second sensor electrodes. In one such embodiment, the method as described in procedures 701-704 further comprises receiving third resulting signals with a third sensor electrode of the second plurality of sensor electrodes, the third resulting signals comprises effects corresponding to the modulated signal and wherein the third resulting signals comprise effects corresponding to the modulated signal driven onto the first sensor electrode. Consider an embodiment where the first sensor electrode is sensor electrode X1 and the second sensor electrode is X2, then in procedure 714, processing system 110A (e.g., sensor module 510) receives third resulting signals from a sensor electrode of the Y sensor electrodes, such as sensor electrode Y5.

With continued reference to FIG. 7G, at procedure 715 of flow diagram 700, the method as described in procedures 701-704 and 714 further comprises, driving a second modulated signal onto the third sensor electrode. Following the above example, where sensor electrode Y5 is the third sensor electrode, in one embodiment, processing system 110A (e.g., sensor module 510) drives a second modulated transmitter signal on sensor electrode Y5. In one embodiment, this second transmitter signal may be modulated in the same or similar manner as the transmitter signal. In one embodiment, the second modulated transmitter signal driven at a different time that does not overlap with the driving of the transmitter signal.

With continued reference to FIG. 7G, at procedure 716 of flow diagram 700, the method as described in procedures 701-704, 714, and 715 further comprises, receiving fourth resulting signals with the third sensor electrode. Following the example where sensor electrode Y5 is the third sensor electrode, in one embodiment, processing system 110A (e.g., sensor module 510) receives fourth resulting signals from sensor electrode Y5.

With continued reference to FIG. 7G, at procedure 717 of flow diagram 700, the method as described in procedures 701-704, 714, 715, and 716 further comprises, receiving fifth resulting signals with the first sensor electrode, the fifth resulting signals comprising effects corresponding to the second modulated signal. Following the example where sensor electrode Y5 is the third sensor electrode and sensor electrode X1 is the first sensor electrode, in one embodiment, processing system 110A (e.g., sensor module 510) receives the fifth resulting signals from sensor electrode X1.

With continued reference to FIG. 7G, at procedure 718 of flow diagram 700, the method as described in procedures 701-704, 714, 715, 716, and 717 further comprises, receiving sixth resulting signals with the second sensor electrode, the sixth resulting signals comprising effects corresponding to the second modulated signal. Following the example where sensor electrode Y5 is the third sensor electrode, sensor electrode X1 is the first sensor electrode, and sensor electrode X2 is the second sensor electrode, in one embodiment, processing system 110A (e.g., sensor module 510) receives the sixth resulting signals from sensor electrode X2.

With continued reference to FIG. 7G, at procedure 719 of flow diagram 700, the method as described in procedures 701-704, 714, 715, 716, 717, and 718 further comprises, determining a first capacitive image along the first axis, a second capacitive image along the second axis, an absolute capacitive profile along the first axis, an absolute capacitive profile along the second axis, a transcapacitive profile along the first axis, and a transcapacitive profile along the second axis based on the first, second, third, fourth, fifth and sixth resulting signals. It is appreciated that many more modulated signals may be driven using the "one hot" technique (for example) described herein or using other techniques. Other resulting signals may be received and included in the first and second capacitive images, the first and second transcapacitive profiles, and the first and second absolute capacitive profiles.

Combined Capacitive Sensing and Absolute Capacitive Sensing

Various embodiments of the present invention provide input devices and methods that facilitate improved usability. In particular, one or more embodiments are directed to a method performed by an input device that switches between combined capacitive sensing and absolute capacitive sensing based on different input device states. For example, input device states may correspond to whether low ground mass (LGM) conditions exist for the input device and/or various types of capacitive coupling with sensor electrodes in the input device. In particular, combined capacitive sensing may describe techniques for the generation and/or analysis of a combination signal using resulting signals that measure effects of both transcapacitance and absolute capacitance within an input device.

In some embodiments, for example, different input device states provide conditions when combined capacitive sensing provides increased signal performance with respect to an input object detection and/or classification. On the other hand, under certain input device conditions, typical absolute capacitive sensing provides increased input device performance. As each sensor electrode side may be tunable, various terms may guide a processing system on when to use an absolute capacitive profile (also called "ABS profile"), a combined profile, or a Transcapacitive profile: (1) the change in transcapacitance ($\Delta C_T$) due to one or more input objects in a sensing region, (2) the change in absolute capacitance ($\Delta C_B$) due to the presence of one or more input objects, and (3) one or more input device states with respect to an input device, such as low ground mass conditions.

Figure 8:
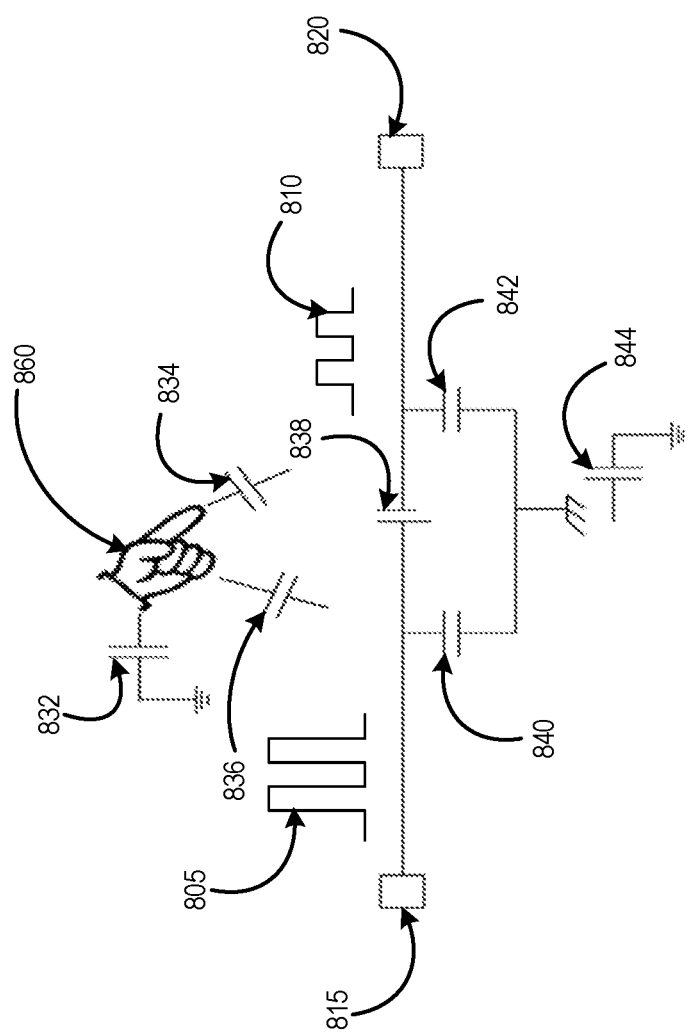
FIG. 8 shows a capacitive diagram in accordance with one or more embodiments.

Turning to FIG. 8, FIG. 8 illustrates a capacitive sensing scheme in accordance with one or more embodiments. In particular, a sensing signal (805) (also called $k_{TX} V_{DD}$), or another sensing signal with a modulated amplitude relative to a receiver electrode is driven along various transmitter electrodes (TX) (815), which produces various resulting signals. Simultaneously, another sensing signal (810) (also called αVDD) is driven along various receiver electrodes (RX) (820). The composite resulting signals are obtained by a receiver (not shown) to generate a combination signal. In particular, $C_T$ (838) is a transcapacitive coupling between the transmitter electrode (815) and the receiver electrode (820), $C_H$ (832) is the capacitance to earth ground of an input object (860), e.g., a user's hand, $C_{B,TX}$ (840) is the absolute capacitance (capacitance to system ground) at the transmitter electrode (815), $C_{B,RX}$ (842) is the absolute capacitance at the receiver electrode (820), $\Delta C_{B,TX}$ (836) is the capacitance between the transmitter electrode (815) and the input object (860), $\Delta C_{B,RX}$ (834) is the capacitance between the receiver electrode (820) and the input object (860), and $C_P$ (844) is the reference capacitance to earth ground in an input device (not shown) implementing the capacitive sensing scheme.

Keeping with FIG. 8, an input device may be configured such that a change in absolute capacitance may reduce in proportion to a change in mutual capacitance (830) between the transmitter electrode (815) and the receiver electrode (820). For example, changes in sensor technology may corroborate a specific profile drive scheme. In particular, a measured capacitive profile signal of an input device may increase when measuring both a transcapacitive signal and an absolute capacitive signal. As such, a combination signal may be the sum of a transcapacitive signal and an absolute capacitive signal. Accordingly, the combination signal may provide a transcapacitive and absolute capacitive profile for capacitive sensing.

Figure 9:
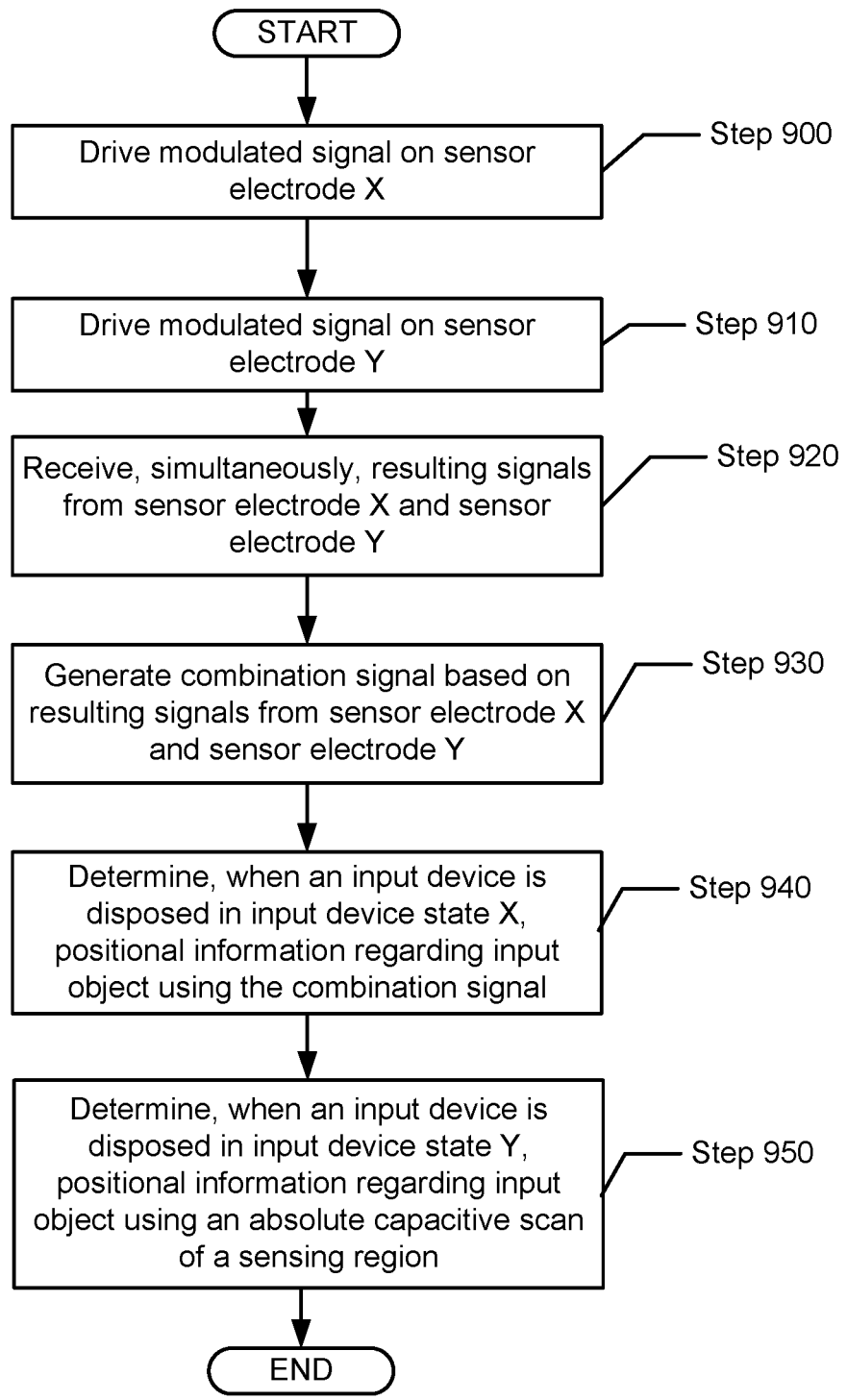
FIG. 9 shows a flowchart for capacitive sensing in accordance with one or more embodiments.

Turning to FIG. 9, FIG. 9 shows a flowchart in accordance with one or more embodiments. Specifically, FIG. 9 describes a method for performing capacitive sensing. The process shown in FIG. 9 may involve, for example, one or more components discussed above in reference to FIGS. 1, 2A, 2B, 3A, 3B, 4, 5, 6A, 6B, 6C, 6D, and 8 (e.g., processing system (110)). While the various steps in FIG. 9 are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 900, a modulated signal is driven on a sensor electrode X in accordance with one or more embodiments. In some embodiments, the modulated signal may be similar to the modulated signals described in FIG. 5 and/or the sensing signal (805) described above in FIG. 8 and the accompanying description. Likewise, sensor electrode X may be a sensor electrode similar to the transmitter electrode (815) described in FIG. 8, the transmitter electrodes and/or receiver electrodes described in FIG. 1, and the sensor electrodes described in FIGS. 2A, 2B, 3A, 3B, 4, 5, 6A, 6B, 6C, and 6D and the accompanying description.

In Step 910, a modulated signal is driven on a sensor electrode Y in accordance with one or more embodiments. In particular, the modulated signals in Steps 900 and 910 may be driven concurrently during a combined capacitive scan of a sensing region. As such, a peak-to-peak voltage amplitude of the modulated signal driven on sensor electrode X may be greater than a peak-to-peak voltage amplitude of the modulated signal driven on sensor electrode Y. Likewise, in some embodiments, the amplitudes of one or both of the modulated signals may be adjusted according to various input device states, such as low ground mass conditions, levels of background capacitance, different types of input objects, etc. As such, sensor electrode X and/or sensor electrode Y may be used as both a transmitter electrode and a receiver electrode.

In some embodiments, sensor X or sensor electrode Y is an overguarded electrode. In normal guarding, the modulated amplitude (also called "drive amplitude") of a modulated signal along a transmitter electrode may be equal to a modulated amplitude of a modulated signal along the receiver electrode. Thus, normal guarding may ensure that no electrical charge is transferred between the capacitively-coupled transmitter electrode and receiver electrode. For an overguarded electrode, the modulated amplitude of the transmitter electrode is larger than the modulated amplitude of the receiver electrode. As such, through overguarding, electrical charge may transfer between the capacitively-coupled transmitter electrode and receiver electrode. Driving the transmitter electrode and the receiver electrode with the same polarity, for example, and not necessarily in-phase, may result in charge subtraction, e.g., removal of charge that may otherwise need to be removed by some receiver-side baseline correction circuit. Thus, in some embodiments, overguarding may be used for baseline correction. Because a finger (or any other conducting input object with ground mass) may reduce the capacitive coupling between a transmitter electrode and receiver electrode, overguarding may consequently increase a resulting signal received at a processing system (e.g. the charge coupled through an increased finger coupling from the receiver to system ground and the corresponding coupling from the overguarding transmitter electrode reduced by the finger combine for an increased total charge coupling to the receiver).

In Step 920, various resulting signals are received simultaneously from sensor electrode X and sensor electrode Y in accordance with one or more embodiments. In particular, one or more of the resulting signals may correspond to changes in absolute capacitance between at least one sensor electrode and one or more input objects. Likewise, one or more of the resulting signals may correspond to changes in a mutual capacitance between sensor electrode X and sensor electrode Y.

In Step 930, a combination signal is generated based on resulting signals from sensor electrode X and sensor electrode Y in accordance with one or more embodiments. For example, sensor circuitry may be coupled to sensor electrode X and sensor electrode Y that is configured to combine two or more resulting signals into a single combination signal. Likewise, a processing system may perform various analog signal conditioning on the combination signal, e.g., with respect to filtering, amplifying, and/or adjusting one or more amplitudes of the combination signal.

In some embodiments, a capacitive scan may be performed by at least one axis of a grid electrode array. In particular, the grid electrode array may include two perpendicular vectors or subsets of sensor electrodes to measure coupling capacitances between the sensor electrodes. Along the orthogonal axis of the grid electrode array, one or more receiver electrodes may measure absolute capacitance. As such, a combined capacitive scan of the same perpendicular vector of sensor electrodes may measure transcapacitive and absolute capacitive coupling capacitances. In some embodiments, the sensor electrodes are modulated with sensing signals that have opposite phases to reduce dynamic range of the absolute capacitive measurement. For example, an absolute capacitance coupling measurement may be extracted from at least one axis of the grid electrode array by summing the combined measurement with the other transcapacitive measurement between the modulated sensor electrodes.

In some embodiments, sensor electrode X and sensor electrode Y are plates within a sensor pattern that form diamond shapes. For example, diamond-shaped plates may be closely spaced and interleaved, so that each diamond-shaped plate of rows in the sensor pattern may have at least two edges (and in most cases four edges) which are adjacent to diamond shape plates of various columns of the sensor pattern. This allows for very symmetric coupling from finger to X and Y electrodes, and for mostly space filling (e.g. on a single layer) with minimized overlap where they cross (e.g. with jumpers).

Moreover, a combination signal for a combined capacitive scan may be generated using various types of sensor electrodes: (1) modulated receiving electrodes for absolute capacitance (e.g. for one axis of the grid electrode array), (2) overguarded transmitter electrodes (with an absolute capacitance measurement), and/or (3) anti-phase (with an absolute capacitance measurement) transmitter electrodes. In some embodiments, a predetermined number of overguarded transmitter electrodes may be configured within the grid electrode array to remove a specific background capacitance charge from the receiver electrodes that measure absolute capacitance.

Furthermore, a processing system may generate a combined capacitive profile from the combination signal. The combined capacitive profile may describe a sensing region of an input device. Accordingly, the processing system may analyze the combined capacitive profile in order to determine positional information and/or object information. In some embodiments, processing systems that use transmitter electrodes, such as application specific integrated circuits (ASICs), may increase an obtain resulting signal using the combined capacitive profile that is greater than the obtained capacitive response from absolute capacitive sensing.

In one or more embodiments, capacitive sensing with a combined capacitive profile produces an increase to signal-to-circuit-noise (SNR) ratio greater than an absolute measurement profile alone. In particular, the total signal-to-circuit noise ratio may improve with the composite of the combined capacitive profile, and where the noise decreases. For example, the SNR may improve by approximately 8 dB. Moreover, in some embodiments, an input device may not require significant baseline correction using combined capacitive sensing, i.e., with respect to the charge removed for measuring a capacitive signal with respect to an input object. For example, baseline correction may be implemented using an input device with such combined capacitive sensing and/or a combined capacitive profile scheme. As such, using a combination signal may reduce the contribution of circuit noise to a signal path within the input device. As such, the increase in SNR from combined capacitive sensing may enable algorithms that may otherwise not work in various OLED panels.

In one or more embodiments, for example, implementation of combined capacitive sensing in an input device enables less baseline correction than implemented with an absolute capacitive profile and/or transcapacitive profile. Furthermore, one or more embodiments may reduce the use of overguarding to perform charge subtraction in an input device, thus reducing the amount of on-chip charge subtraction (aka CBC). Thus, combined capacitive sensing may reduce the amount of circuit area in the processing system designated for charge subtraction. Noise reduction may also be achieved with combined capacitive sensing with respect to a particular sensor electrode receiver channel.

In Step 940, when an input device is disposed in input device state X, positional information regarding one or more input objects is determined using a combination signal in accordance with one or more embodiments. For example, in response to various input device states, a processing system may determine when to use an absolute capacitive profile, a combined capacitive profile, and/or a transcapacitive profile to determine positional information and/or other object information. For example, one input device state may correspond to a change in trans-capacitance ($\Delta C_T$) due to the presence of one or more input objects in a sensing region. Another input device state may correspond to the change in absolute capacitance ($\Delta C_B$) between one or more sensor electrodes and one or more input objects. Thus, a processing system may designate one or more predetermined input device states for using the combination signal. Moreover, the processing system may use the combinational signal, resulting signals from absolute capacitive scans and/or transcapacitive scans, absolute capacitive measurements, transcapacitive measurements, etc. to determine the input device state of the input device.

In some embodiments, a processing system implements one or more thresholds for designating different input device states. For example, a threshold may correspond to a specific capacitive value or range of capacitive values where a combined capacitive scan, an absolute capacitive scan, and/or a transcapacitive scan are performed. In one or more embodiments, for example, a processing system designates two or more combined capacitive thresholds that define when to perform combined capacitive sensing. When one or more of the combined capacitive thresholds are not satisfied by the current capacitive measurements in an input device, a processing system may switch to absolute capacitive sensing and/or transcapacitive sensing.

In some embodiments, one or more predetermined input device states correspond to various low ground mass state conditions. For example, a processing system may use a combination signal to determine positional information and/or other object information when pre-determined ground mass state conditions exist in an input device and other capacitive sensing techniques for other ground mass states. In some embodiments, for example, various thresholds for combined capacitive sensing may correspond to specific low ground mass conditions within the input device. Likewise, when a processing system detects poor low ground mass conditions in the input device, the processing system may switch to absolute capacitive sensing, e.g., as shown in Step 950 below.

In some embodiments, positional information and/or object information is determined by comparing a measured combination signal with a baseline combination signal. For example, a baseline combination signal may be generated when no input object is located in a sensing region, during a period of low interference in an input device, and/or at other predetermined times. Likewise, rather than a baseline combination signal, various combined capacitive measurements and/or absolute capacitive measurements may be used as baseline measurements to analyze the measured combination signal. Moreover, multiple baseline combination signals may be used to analyze a measured combination signal. In particular, a baseline combination signal may be generated for one or more axes of a sensor electrode pattern.

When a measured combination signal is generated in response to one or more input objects in a sensing region, a processing system may thus use one or more of the baseline combination signals to determine the positional information and/or object information regarding the one or more input objects.

In Step 950, when an input device is disposed in input device state Y, positional information regarding one or more input objects is determined using an absolute capacitive scan of a sensing region in accordance with one or more embodiments. For example, a processing system may switch to absolute capacitive sensing based on detecting one or more input device states. The absolute capacitive scan may be performed using sensor electrode X, sensor electrode Y, and/or a different set of sensor electrodes, for example.

In some embodiments, an input device configured with a combined capacitive profile may provide the elimination of a global coarse baseline correction (GCBC) circuit. For example, a GCBC circuit may set various limits on the maximum sense frequency of absolute capacitive sensing signals. As such, an input device using combined capacitive profiles may operate at higher capacitive sensing frequencies without the GCBC circuit. In other words, the combined capacitive profile may eliminate the use of slower circuits in various input devices. In another embodiment, an input device configured to use a combined capacitive profile may reduce or eliminate baseline shifts between active modes (e.g., low-power to high-power).

In one or more embodiments, an input device switches from combined capacitive sensing or absolute capacitive sensing to transcapacitive profile sensing based on one or more input device states detected by a processing system.

In one or more embodiments, an input device includes functionality to use a combined capacitive profile to detect and measure ungrounded objects, e.g., moisture, sensitivity. For example, a combined capacitive profile may distinguish between grounded objects (e.g., human touch) and ungrounded objects (e.g., moisture/water, oil, coins, etc.). In another example, when moisture is present on an input object and/or input device, a combined capacitive profile may be sensitive to the moisture. As such, combined capacitive profiles may be used to detect moisture and/or as adjunct information to one or more moisture detection algorithms. When an input device is set to detect moisture, a combined capacitive profile may be used to determine where the moisture is located on the input device. For example, moisture may cause a negative delta response in a combined capacitive profile, while a finger may cause a positive delta response in the combined capacitive profile.

Figure 11:
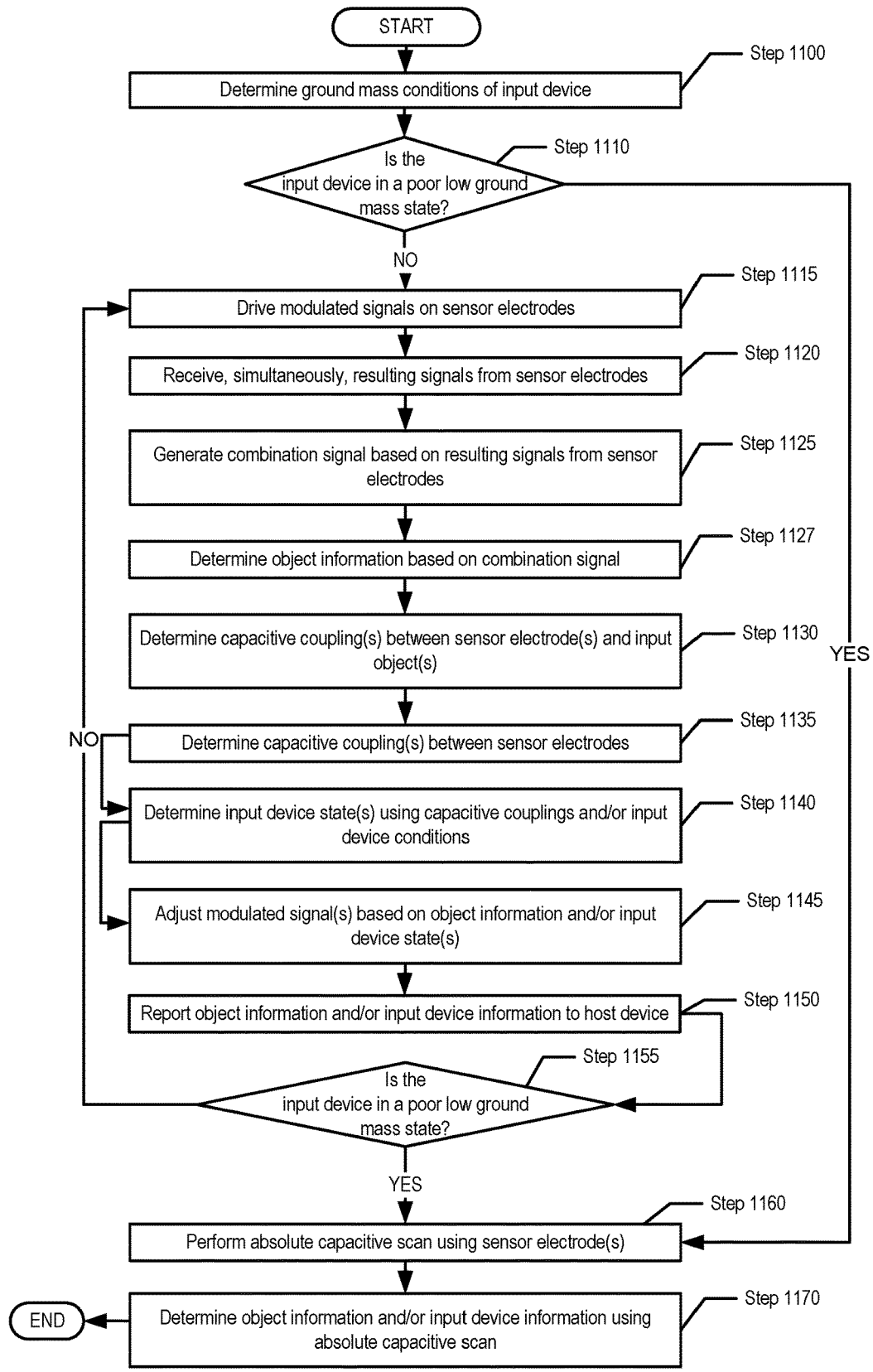
FIG. 11 shows a flowchart for capacitive sensing in accordance with one or more embodiments.
Figure 12:
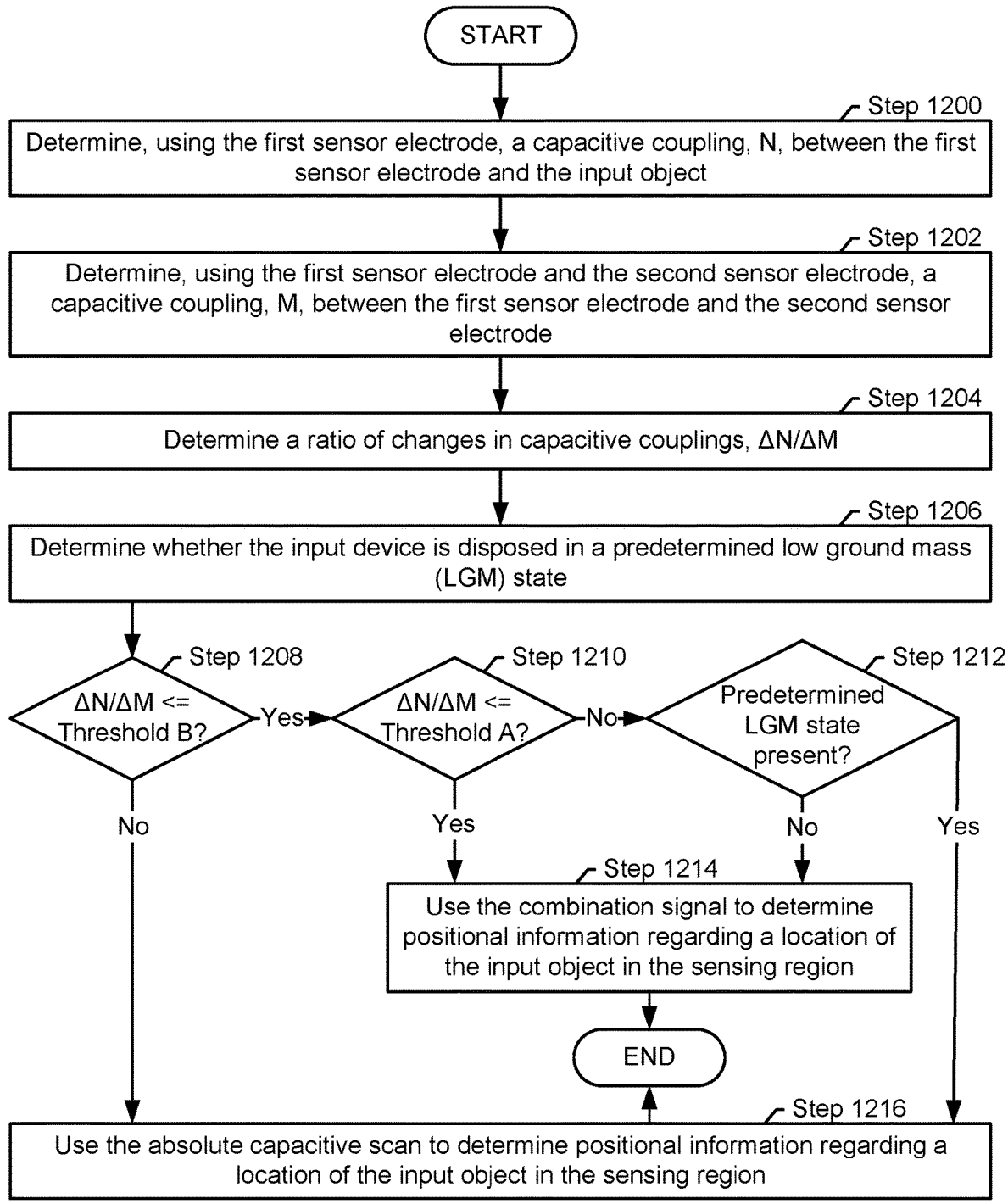
FIG. 12 shows a flowchart for capacitive sensing in accordance with one or more embodiments.

In one or more embodiments, the processes described in FIG. 9, FIG. 11, and FIG. 12 may be implemented with respect to one or more display devices. In particular, in some embodiments, an input device using one or more disclosed techniques may be implemented in an organic light emitting diode (OLED) device.

Figure 10:
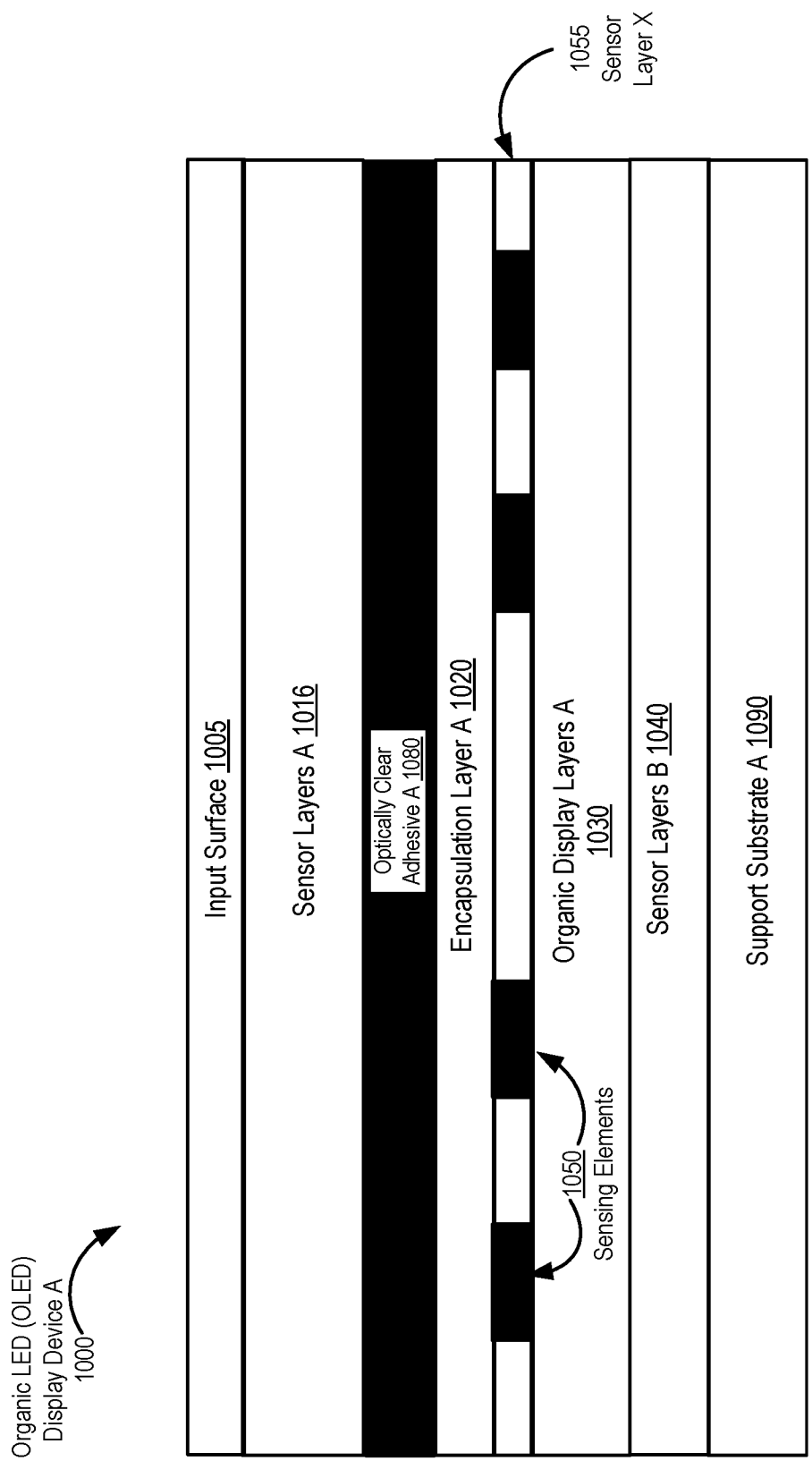
FIG. 10 shows a system in accordance with one or more embodiments.

Turning to FIG. 10, FIG. 10 shows a schematic view of an OLED display device A (1000) in accordance with one or more embodiments. As shown in FIG. 10, the OLED display device A (1000) may include various display layers (e.g., input surface (1005), sensor layers A (1016), sensor layers B (1040), sensor layer X (1055), an encapsulation layer A (1020), organic display layers A (1030), and a support substrate A (1090)), such as glass. A display layer may be a substrate within a display device that is configured to perform functionality such as generating an output to a user (e.g., with respect to audio and/or visual outputs), obtaining an input from a user (e.g., detect proximity of an input object at the display device), and/or providing physical support for one or more components within the display device. A display layer, such as sensor layer X (1055), may include various sensing elements (e.g., sensing elements (1050)), such as sensor electrodes, transmitter electrodes, receiver electrodes, force sensors, thin-film transistors, diodes, etc. Accordingly, one or more display layers may operate cooperatively to perform a particular function with respect to the display device. The OLED display device A (1000) may be a white OLED, a foldable OLED, a transparent OLED, a passive-matrix or active-matrix OLED, a top-emitting OLED, or among various other types of OLED devices.

Moreover, the OLED display device A (1000) may include proximity-sensing functionality that detects the location of one or more input objects disposed in a sensing region. Likewise, sensor layer A (1016) and/or sensor layer B (1040) may include various sensor electrodes that include functionality for generating combination signals. The transmitter electrodes and/or the receiver electrodes in the sensor layers (1016, 1040) may be similar to the transmitter electrode (815) described in FIG. 8, the transmitter electrodes and/or receiver electrodes described in FIG. 1, and the sensor electrodes described in FIGS. 2A, 2B, 3A, 3B, 4, 5, 6A, 6B, 6C, and 6D and the accompanying description.

In particular, the OLED display device A (1000) may include various organic display layers (e.g., organic display layers A (1030)) composed of organic molecules or polymers. The organic display layers A (1030) may include functionality to generate visible light that presents visual data to a user. For example, the organic display layers A (1030) may include an emissive layer and a conductive layer. Likewise, the OLED display device A (1000) may also include various non-organic display layers (not shown) such as a cathode layer and/or an anode layer that include functionality for operating organic display layers. Moreover, intersections of a cathode layer and an anode layer may be arranged to form various pixels within the OLED display device A (1000). Likewise, different types of visible light may be generated by a particular pixel within the OLED display device A (1000). Further, organic display layers may be disposed on a support substrate (e.g., support substrate A (1090)) that may be flexible or rigid.

Keeping with FIG. 10, the OLED display device A (1000) may include an encapsulation layer (e.g., encapsulation layer A (1020)) that includes functionality to provide a barrier around various organic display layers (e.g., organic display layers A (1030)). For example, the encapsulation layer A (1020) may be a single layer or multiple layers disposed on, above, or below the organic display layers A (1030). As such, the encapsulation layer A (1020) may be a thin film that includes organic and/or inorganic chemical layers that protects various organic display layers from oxygen, water vapor, and/or other harmful substances to OLEDs.

In one or more embodiments, one or more display layers in the OLED display device A (1000) may include various thin-film transistors that include functionality for detecting an input force (not shown) and/or the location of one or more input objects (not shown) in a sensing region. For example, sensing elements in the OLED display device A (1000) may include thin-film transistors disposed below the encapsulation layer A (1020) in an oxygen-protected region of the OLED display device A (1000). For example, other TFT electrodes may exist in the protected region along with the sensing elements (1050). The other TFT electrodes may include functionality to implement an active-matrix OLED device, for example, that controls image generation within the OLED display device A (1000). While several types of display layers are shown in FIG. 10, an OLED display device may include other display layers not shown, such as an additional encapsulation layer, a buffer layer, a TFT backplane, etc.

Turning to FIG. 11, FIG. 11 shows a flowchart in accordance with one or more embodiments. Specifically, FIG. 11 describes a method for performing capacitive sensing. The process shown in FIG. 11 may involve, for example, one or more components discussed above in reference to FIGS. 1, 2A, 2B, 3A, 3B, 4, 5, 6A, 6B, 6C, 6D, and 8 (e.g., processing system (110)). While the various steps in FIG. 11 are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 1100, one or more ground mass conditions of an input device are determined in accordance with one or more embodiments. For example, various ground mass conditions may be determined by a processing system using dual nodes that detect for parasitic capacitance in an input device. Likewise, various types of capacitive scans may be performed to determine whether low ground mass conditions are present in the input device. Moreover, a combined capacitive profile of a sensing region may be generated using a combination signal. As such, the combined capacitive profile may be analyzed for low ground mass conditions accordingly.

In Step 1110, a determination is made whether an input device is in a poor low ground mass state in accordance with one or more embodiments. For example, a processing system may analyze the ground mass conditions of the input device detected in Step 1100 to determine whether the input device is disposed among one or more low ground mass states. In one example, a particular low ground mass state may correspond to an inverted capacitive response for a sensing region. When a low ground mass state is encountered, the transcapacitive response may invert in response to an object in the sensing region. In another example, a low ground mass state may correspond to a reduction in amplitude over the capacitive response. In one or more embodiments, a processing system analyzes low ground mass conditions with respect to various types of capacitive couplings with one or more input devices, e.g., the mutual capacitance between sensor electrodes, the difference in absolute capacitance between an input object and a sensor electrode, etc. For example, the processing system may analyze ratios between capacitance values, maximum capacitance values, minimum values, etc. in order to determine whether a ground mass state corresponds to a poor state (when the ground mass is unacceptably low) or an acceptable state.

Furthermore, based on whether an input device is disposed in a predetermined poor low ground mass state or a predetermined acceptable low ground mass state, the input device may switch between absolute capacitive sensing and combined capacitive sensing. In some embodiments, depending on various absolute capacitance values and/or transcapacitance values, combined capacitive sensing is selected even under the worst low ground mass conditions. When a determination is made that an input device is disposed in a poor low ground mass state, the process may proceed to Step 1160. When a determination is made that the input device is disposed in a predetermined acceptable low ground mass state, the process may proceed to Step 1115.

In some embodiments, beside low ground mass states, other input device states trigger a processing system to switch between combined capacitive sensing and absolute capacitive sensing. For example, various types of capacitive couplings such as different types of input objects, amounts of background capacitance, etc. may correspond to one or more input device states that cause an input device to use a combined capacitive profile, an absolute capacitive scan, and/or a transcapacitive profile.

In Step 1115, various modulated signals are driven on various sensor electrodes in accordance with one or more embodiments. The modulated signals and/or the sensor electrodes may be similar to the modulated signals and/or sensor electrodes described above in Steps 900 and 910 and the accompanying description.

In Step 1120, various resulting signals are simultaneously received from various sensor electrodes in accordance with one or more embodiments. The resulting signals may be similar to the resulting signals described above in Step 920 and the accompanying description.

In Step 1125, a combination signal is generated based on various resulting signals from various sensor electrodes in accordance with one or more embodiments. The combination signal may be generated in a similar manner as the combination signal described above in Step 930 and the accompanying description.

In Step 1127, object information is determined using the combination signal in accordance with one or more embodiments. For example, object information may include various characteristics of one or more input objects, such as input object size and/or the type of input object, e.g., an index finger, a palm, a user's face, stylus, etc. Likewise, a processing system may determine object information from a combination signal's combined capacitive profile, for example, by comparing the combination signal with one or more capacitive templates corresponding to various capacitive profiles, for example.

In Step 1130, one or more capacitive couplings are determined between one or more sensor electrodes and one or more input objects in accordance with one or more embodiments. In some embodiments, for example, a processing system may use the combination signal from Step 1125 and/or perform an absolute capacitive scan to detect various capacitive couplings. For example, a capacitive coupling may correspond to the difference in absolute capacitance between one or more sensor electrodes and an input object. Likewise, the processing system may compute absolute capacitive measurements regarding the change in absolute capacitance and store the capacitive measurements for later processing. The capacitive coupling between the sensor electrodes and one or more input objects may be measured in a similar manner as the capacitive coupling techniques described above in FIGS. 1, 2A, 2B, 3A, and 3B and the accompanying description.

In Step 1135, one or more capacitive couplings are determined between various sensor electrodes in accordance with one or more embodiments. For example, a processing system may measure the transcapacitance between the sensor electrodes to compute various transcapacitive measurements that may be stored for later processing. The capacitive coupling between the sensor electrodes and one or more input objects may be measured in a similar manner as the capacitive coupling techniques described above in FIGS. 1, 2A, 2B, 3A, and 4 and the accompanying description.

In Step 1140, one or more input device states are determined using one or more capacitive couplings and/or one or more input device conditions in accordance with one or more embodiments. In some embodiments, an input device analyzes the capacitive coupling between sensor electrodes and/or one or more input objects, e.g., the capacitive couplings determined in Steps 1135 and 1140, to determine the current input device state. Moreover, the input device state may be determined from various input device conditions, such as low ground mass conditions. The processing system may analyze the capacitive couplings and/or input device conditions to determine whether the input device is disposed in the same input device state or a different input device state from the input device state determined in Step 1110 above.

In Step 1145, one or more modulated signals are adjusted based on object information and/or one or more input device states in accordance with one or more embodiments. In particular, a processing system may tune various modulated signals by changing the amplitude, frequency, and/or phase of the modulated signals that generate a combination signal. In some embodiments, for example, the modulated signals are adjusted to achieve a predetermined amount of background capacitance. If the background capacitance decreases in an input device, for example, various driven modulated signals may be adjusted to require less charge in the input device. In another example, the modulated signals may be adjusted to produce a specific charge collected at the processing system.

In Step 1150, object information and/or input device information is reported to a host device in accordance with one or more embodiments. For example, object information may be similar to the object information above in Step 1127 and the accompanying description. Input device information may describe one or more input device states. Moreover, the object information and/or input device information may be reported to a host device, such as an electronic system coupled to an input device. On the host device, the information may trigger one or more interface actions within a graphical user interface. For example, interface actions may include opening, moving, and/or closing windows within a graphical user interface. For more information on graphical user interfaces and interface actions, see FIG. 14 below and the accompanying description.

In Step 1155, a determination is made whether an input device is disposed in a poor low ground mass state in accordance with one or more embodiments. In particular, the processing system may determine whether the current input device state corresponds to combined capacitive profile sensing, absolute capacitance scanning, or transcapacitive sensing techniques. If the ground mass state is the same as the ground mass state detected in Step 1110, then the input device may continue to perform combined capacitive sensing. If the input device has entered a poor ground mass state, for example, the input device may switch to absolute capacitive sensing of a sensing region. Likewise, various capacitive couplings may be analyzed along with the low ground mass state to determine whether to perform combined capacitive sensing, absolute capacitive sensing, and/or transcapacitive sensing. When a determination is made that an input device is disposed in a poor low ground mass state, the process may proceed to Step 1160. When a determination is made that the input device is disposed in a predetermined acceptable low ground mass state, the process may proceed to Step 1115.

In Step 1160, an absolute capacitive scan is performed using one or more sensor electrodes in accordance with one or more embodiments. The absolute capacitive scan may be performed in a similar manner as the absolute capacitive scanning techniques described above in FIGS. 1, 2A, 2B, 3A, 3B, and 4, and the accompanying description.

In Step 1170, object information and/or input device information is determined using an absolute capacitive scan in accordance with one or more embodiments. Using a capacitive image obtained from an absolute capacitive scan, for example, various absolute capacitive measurements in the capacitive image may identify whether an input object is a finger, glove, stylus, etc. In particular, a processing system may analyze absolute capacitive measurements to determine a shape of an input object. The processing system may compare a detected shape with pre-stored templates and/or perform various input object identification algorithms on the absolute capacitive measurements to determine the type of input object. Likewise, the intensity of the change in capacitance at one or more receiver electrodes may identify other object information regarding one or more input objects in the sensing region.

Turning to FIG. 12, a flowchart in accordance with one or more embodiments is shown. Specifically, FIG. 12 describes a method for performing capacitive sensing. The process shown in FIG. 12 may involve, for example, one or more components discussed above in reference to FIGS. 1, 2A, 2B, 3A, 3B, 4, 5, 6A, 6B, 6C, 6D, and 8 (e.g., processing system (110)). While the various steps in FIG. 12 are presented and described sequentially, one of ordinary skill in the art will appreciate that some or all of the steps may be executed in different orders, may be combined or omitted, and some or all of the steps may be executed in parallel. Furthermore, the steps may be performed actively or passively.

While FIG. 12 describes the processing of signals, e.g., signals obtained from the first sensor electrode and the second sensor electrode, additional steps may be performed to obtain these signals. For example, steps analogous to the steps described in FIG. 11 may be performed to drive the sensor electrodes (Step 1115), to receive signals from the sensor electrodes (Step 1120), to generate a combination signal (Step 1125), etc.

Further, the method described in FIG. 12 may be repeatedly executed (e.g., in a loop), to repeatedly obtain positional information.

In Step 1200, one or more capacitive couplings are determined between one or more sensor electrodes and one or more input objects in accordance with one or more embodiments, and as previously discussed. Broadly speaking, the capacitive coupling between the sensor electrodes and one or more input objects may be measured in a similar manner as the capacitive coupling techniques described above in FIGS. 1-9 and the accompanying description. In addition to an absolute capacitive coupling, N, between a sensor electrode and an input object, a change in absolute capacitance $\Delta N$ (e.g., in presence of an input object vs in absence of an input object) may be computed.

In Step 1202, one or more capacitive couplings are determined between various sensor electrodes in accordance with one or more embodiments. For example, a processing system may measure the transcapacitance between the sensor electrodes to compute various transcapacitive measurements. The capacitive coupling between the sensor electrodes may be measured in a similar manner as the capacitive coupling techniques described above in FIGS. 1-9 and the accompanying description. In addition to a transcapacitive coupling, M, between a sensor electrode and an input object, a change in transcapacitance $\Delta M$ (e.g., in presence of an input object vs in absence of an input object) may be computed.

In Step 1204, a ratio of changes in capacitive couplings, $\Delta N/\Delta M$ is determined. The ratio represents the change in absolute capacitance over the change in transcapacitance.

In Step 1206, a determination is made whether an input device is in a predetermined low ground mass (LGM) state in accordance with one or more embodiments. For example, a processing system may analyze the ground mass conditions of the input device detected as previously described (e.g., Step 1100 of FIG. 11) to determine whether the input device is disposed among one or more low ground mass states. In one example, a particular low ground mass state may correspond to an inverted capacitive response for a sensing region. When a low ground mass state is encountered, the transcapacitive response may invert in response to an object in the sensing region. In another example, a low ground mass state may correspond to a reduction in amplitude over the capacitive response. In one or more embodiments, a processing system analyzes low ground mass conditions with respect to various types of capacitive couplings with one or more input devices, e.g., the mutual capacitance between sensor electrodes, the difference in absolute capacitance between an input object and a sensor electrode, etc. For example, the processing system may analyze ratios between capacitance values, maximum capacitance values, minimum values, etc. in order to determine whether a ground mass state corresponds to a poor state (when the ground mass is unacceptably low), considered the predetermined low ground mass state, or an acceptable state.

In Step 1208, a determination is made whether the ratio of changes in capacitive couplings, $\Delta N/\Delta M$ is less than or equal to a threshold B. Threshold B may be the upper threshold of two thresholds establishing a range. The lower threshold may be a threshold A. When the ratio is less than or equal to threshold B, the method may proceed with the execution of Step 1210. Alternatively, when the ratio is greater than threshold B, the method may proceed with the execution of Step 1216.

In Step 1210, a determination is made whether the ratio of changes in capacitive couplings, $\Delta N/\Delta M$ is less than or equal to the threshold A. When the ratio is less than or equal to threshold A, the method may proceed with the execution of Step 1214. Alternatively, when the ratio is greater than threshold A, the method may proceed with the execution of Step 1212.

In Step 1212, depending on whether the predetermined LGM state is present, the method may proceed with the execution of either Step 1214 (when the predetermined LGM state is not present), or Step 1216 (when the predetermined LGM state is present).

In Step 1214, object information is determined using a combination signal in accordance with one or more embodiments. The combination signal may be as described in Step 1125 of FIG. 11. Object information may include, for example, various characteristics of one or more input objects, such as input object size and/or the type of input object, e.g., an index finger, a palm, a user's face, stylus, etc. Likewise, a processing system may determine object information from a combination signal's combined capacitive profile, for example, by comparing the combination signal with one or more capacitive templates corresponding to various capacitive profiles, for example.

In Step 1216, object information is determined using an absolute capacitive scan in accordance with one or more embodiments. Using a capacitive image obtained from an absolute capacitive scan, for example, various absolute capacitive measurements in the capacitive image may identify whether an input object is a finger, glove, stylus, etc. In particular, a processing system may analyze absolute capacitive measurements to determine a shape of an input object. The processing system may compare a detected shape with pre-stored templates and/or perform various input object identification algorithms on the absolute capacitive measurements to determine the type of input object. Likewise, the intensity of the change in capacitance at one or more receiver electrodes may identify other object information regarding one or more input objects in the sensing region.

Turning to FIG. 13 an example of a hybrid capacitive sensing scheme, in accordance with one or more embodiments, is shown. The following example is for explanatory purposes only and not intended to limit the scope of the invention.

In FIG. 13, an input device performs a transcapacitive scan (1310) of a sensing region to determine a transcapacitance value M (1317) for the capacitive difference (1315) between sensor electrodes. Likewise, the input device also performs an absolute capacitive scan (1320) to determine an absolute capacitance value N (1327) for the capacitive difference (1325) between sensor electrodes and an input object. Moreover, a processing system coupled to the input device analyzes the transcapacitance value M (1317) and the absolute capacitive value N (1327). In particular, the processing system applies a capacitive sensing determination function A (1331) to a ratio (1335) $\Delta N/\Delta M$. $\Delta N$ is a change of the absolute capacitance value N (1327) in response to the presence of an input object (e.g., a finger). $\Delta M$ is a change of the transcapacitance value M (1317) in response to the presence of the input object. When the ratio (1335) is less than or equal to threshold A (1337), a combined capacitive sensing may be used for the sensing region, regardless of whether a low ground mass (LGM) condition is present or not. Threshold A (1337) may be set to, for example, "2". When the ratio (1335) is greater than threshold A (1337) but less than threshold B (1338), the presence of absence of the LGM may be considered when deciding whether the use of a combined capacitive sensing is appropriate. Specifically, when an LGM condition is not detected, a combined capacitive sensing may be used for the sensing region. However, when an LGM condition is detected, an absolute capacitive sensing may instead be used for the sensing region. Threshold B (1338) may be set to, for example, "5". When the ratio (1335) is greater than or equal to threshold B (1338), an absolute capacitive sensing may be used for the sensing region, regardless of whether an LGM condition is present or not.

In general, in one aspect, some embodiments relate to a processing system. The processing system includes a sensor module that includes sensing circuitry configured to couple with various sensor electrodes in an input device. The sensor module may be configured to drive a first modulated signal onto a first sensor electrode among the sensor electrodes and a second modulated signal onto a second sensor electrode among the plurality of sensor electrodes. The sensor module may be further configured to receive, simultaneously, a first resulting signal from the first sensor electrode and a second resulting signal from the second sensor electrode. The sensor module may be further configured to generate, based at least in part on the first resulting signal and the second resulting signal, a first combination signal. The processing system further includes a determination module configured to couple with the plurality of sensor electrodes. The determination module may be further configured to determine, using the first combination signal and when an input device is disposed in a first input device state, first positional information regarding a location of an input object in a sensing region of the input device. The determination module is further configured to determine, when the input device is disposed in a second input device state, second positional information regarding the location of the input object in the sensing region using an absolute capacitive scan of the sensing region.

In general, in one aspect, some embodiments relate to an electronic system. The electronic system may include a display device. The electronic system may further include an input device comprising a first sensor electrode and the second sensor electrode. The first sensor electrode may be configured to drive a first modulated signal, and the second sensor electrode may be configured to drive a second modulated signal. The input device further comprises receiver circuitry coupled to the first sensor electrode and the second sensor electrode. The receiver circuitry may be configured to receive a first resulting signal from the first sensor electrode and a second resulting signal from the second sensor electrode. The receiver circuitry may be further configured to generate a combination signal based at least in part on the first resulting signal and the second resulting signal. The input device may be configured to determine, using the combination signal and in response to the input device being disposed in a first input device state, first positional information regarding a location of an input object in a sensing region of the input device. The input device is further configured to determine, in response to the input device being disposed in a second input device state, second positional information regarding the location of the input object in the sensing region using an absolute capacitive scan of the sensing region.

In general, in one aspect, some embodiments relate to a method of capacitive sensing. The method may include driving a first modulated signal onto a first sensor electrode in an input device and a second modulated signal onto a second sensor electrode in the input device. The method may further include receiving, simultaneously, a first resulting signal from the first sensor electrode and a second resulting signal from the second sensor electrode. The method may further include generating, based at least in part on the first resulting signal and the second resulting signal, a combination signal. The method may further include determining, using the combination signal and when the input device is disposed in a first input device state, first positional information regarding a location of an input object in a sensing region of the input device. The method may further include determining, when the input device is disposed in a second input device state, second positional information regarding the location of the input object in the sensing region using an absolute capacitive scan of the sensing region.

In some embodiments, various sensor electrodes in an input device include a grid electrode array. The grid electrode array may include a first subset of sensor electrodes perpendicular to a second subset of sensor electrodes. The first subset of sensor electrodes may include at least one absolute capacitance receiver electrode. The second subset of sensor electrodes may include various overguarded transmitter electrodes. A sensor module in the input device may be configured to generate a combination signal that includes effects of an absolute capacitive coupling between the at least one absolute capacitance receiver electrode and one or more input objects. The second combination may further include effects of transcapacitance between the overguarded transmitter electrodes.

In some embodiments, an input device is configured to generate a baseline combination signal when no input object is located in a sensing region of the input device. For example, a processing system coupled to the input device may be configured to compare a generated combination signal with the baseline combination signal to determine positional information and/or object information regarding one or more input objects located in a sensing region of the input device.

Figure 14:
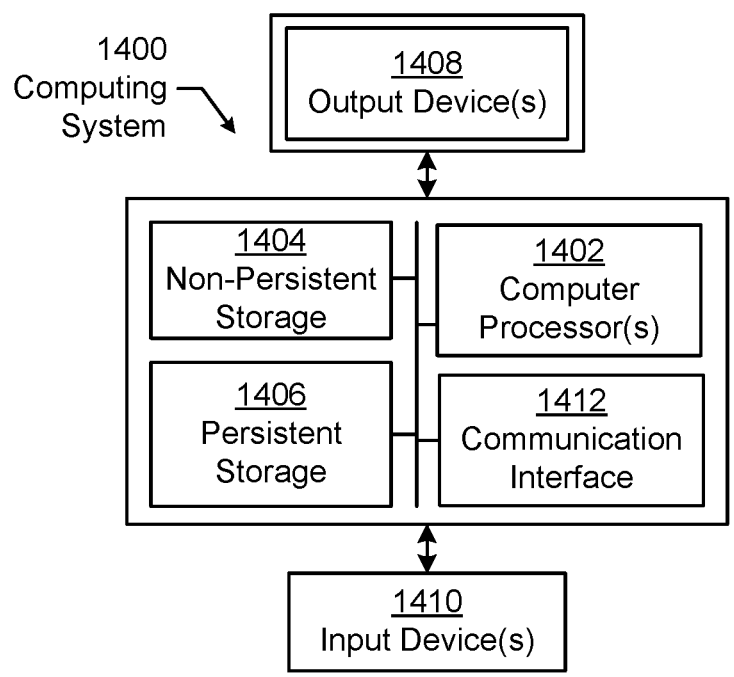
FIG. 14 shows a computing system in accordance with one or more embodiments.

Embodiments may be implemented on a computing system. Any combination of mobile, desktop, server, router, switch, embedded device, or other types of hardware may be used. For example, as shown in FIG. 14, the computing system (1400) may include one or more computer processors (1402), non-persistent storage (1404) (e.g., volatile memory, such as random access memory (RAM), cache memory), persistent storage (1406) (e.g., a hard disk, an optical drive such as a compact disk (CD) drive or digital versatile disk (DVD) drive, a flash memory, etc.), a communication interface (1412) (e.g., Bluetooth interface, infrared interface, network interface, optical interface, etc.), and numerous other elements and functionalities.

The computer processor(s) (1402) may be an integrated circuit for processing instructions. For example, the computer processor(s) may be one or more cores or micro-cores of a processor. The computing system (1400) may also include one or more input devices (1410), such as a touchscreen, keyboard, mouse, microphone, touchpad, electronic pen, or any other type of input device.

The communication interface (1412) may include an integrated circuit for connecting the computing system (1400) to a network (not shown) (e.g., a local area network (LAN), a wide area network (WAN) such as the Internet, mobile network, or any other type of network) and/or to another device, such as another computing device.

Further, the computing system (1400) may include one or more output devices (1408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1402), non-persistent storage (1404), and persistent storage (1406). Many different types of computing systems exist, and the aforementioned input and output device(s) may take other forms.

Software instructions in the form of computer readable program code to perform embodiments of the disclosed technology may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosed technology.

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, only one authorized process may mount the shareable segment, other than the initializing process, at any given time.

Other techniques may be used to share data, such as the various data described in the present application, between processes without departing from the scope of the disclosed technology. The processes may be part of the same or different application and may execute on the same or different computing system.

Rather than or in addition to sharing data between processes, the computing system performing one or more embodiments of the disclosed technology may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosed technology, may extract one or more data items from the obtained data. For example, the extraction may be performed as follows by the computing system (1400) in FIG. 14. First, the organizing pattern (e.g., grammar, schema, layout) of the data is determined, which may be based on one or more of the following: position (e.g., bit or column position, $N_{th}$ token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 14, while performing one or more embodiments of the disclosed technology, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosed technology, A and B may be vectors, and comparing A with B requires comparing the first element of vector A with the first element of vector B, the second element of vector A with the second element of vector B, etc. In one or more embodiments, if A and B are strings, the binary values of the strings may be compared.

The computing system in FIG. 14 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The computing system of FIG. 14 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present only a few examples of functions performed by the computing system of FIG. 14. Other functions may be performed using one or more embodiments of the disclosed technology.

The examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. A processing system comprising:
  a sensor module comprising sensing circuitry coupled to a plurality of sensor electrodes in an input device, the sensor module configured to:
    drive a first modulated signal onto a first sensor electrode among the plurality of sensor electrodes and a second modulated signal onto a second sensor electrode among the plurality of sensor electrodes,
    receive, simultaneously, a first resulting signal from the first sensor electrode and a second resulting signal from the second sensor electrode, and
    generate, based at least in part on the first resulting signal and the second resulting signal, a first combination signal; and
  a determination module coupled to the plurality of sensor electrodes, the determination module configured to:
    determine, using the first sensor electrode, a change in an absolute capacitive coupling between the first sensor electrode and an input object in a sensing region of the input device;
    determine, using the first sensor electrode and the second sensor electrode, a change in a transcapacitive coupling between the first sensor electrode and the second sensor electrode;

determine whether a ratio of the change in the absolute capacitive coupling to the change in the transcapacitive coupling exceeds a first predetermined threshold;

determine whether the input device is disposed in a predetermined low ground mass state;

determine, using the first combination signal, when the input device is not disposed in the predetermined low ground mass state, and when the ratio fails to exceed the first predetermined threshold, first positional information regarding a location of the input object in the sensing region; and determine, when the ratio fails to exceed the first predetermined threshold and when the input device is disposed in the predetermined low ground mass state, second positional information regarding the location of the input object in the sensing region using an absolute capacitive scan of the sensing region.

2. The processing system of claim 1, wherein the determination module is further configured to:

determine whether the ratio of the change in the absolute capacitive coupling to the change in the transcapacitive coupling fails to exceed a second predetermined threshold, wherein the second predetermined threshold is lower than the first predetermined threshold; and determine, using the first combination signal, when the ratio fails to exceed the second predetermined threshold, regardless of whether the input device is disposed in the predetermined low ground mass state, third positional information regarding a location of the input object in the sensing region.

3. The processing system of claim 1, wherein the determination module is further configured to:

determine, when the ratio exceeds the first predetermined threshold, and regardless of whether the input device is disposed in the predetermined low ground mass state, third positional information regarding the location of the input object in the sensing region using an absolute capacitive scan of the sensing region.

4. The processing system of claim 1, wherein the plurality of sensor electrodes comprises a grid electrode array, the grid electrode array comprising a first subset of sensor electrodes perpendicular to a second subset of sensor electrodes, wherein the first subset of sensor electrodes comprises at least one absolute capacitive receiver electrode, wherein the second subset of sensor electrodes comprises a plurality of overguarded transmitter electrodes, wherein the sensor module is further configured to generate a second combination signal that comprises effects of an absolute capacitive coupling between the at least one absolute capacitive receiver electrode and one or more input objects, and wherein the second combination signal further comprises effects of transcapacitance between the plurality of overguarded transmitter electrodes.

5. The processing system of claim 1, wherein the sensor module is further configured to generate a baseline combination signal when no input object is located in the sensing region, and wherein the determination module is further configured to compare first combination signal to the baseline combination signal to determine the first positional information.

6. The processing system of claim 1, wherein the sensor module is further configured to perform a transcapacitive scan of the sensing region using the plurality of sensor electrodes, and wherein the determination module is further configured to switch, in response to determining an input device state, to performing the transcapacitive scan.

7. The processing system of claim 1, wherein generating the first combination signal comprises summing the first resulting signal and the second resulting signal to produce the first combination signal.

8. The processing system of claim 1, wherein the first modulated signal comprises a first modulated amplitude, and wherein the second modulated signal comprises a second modulated amplitude that is less than the first modulated amplitude.

9. The processing system of claim 1, wherein the first combination signal comprises effects of the transcapacitive coupling between the first sensor electrode and the second sensor electrode and effects of the absolute capacitive coupling between the second sensor electrode and the input object.

10. The processing system of claim 1, wherein the input device is disposed in an organic light emitting diode (OLED) display device.

11. The processing system of claim 1, wherein the first modulated signal and the second modulated signal are driven concurrently.

12. An electronic system comprising:

a display device; and an input device comprising:

a plurality of sensor electrodes comprising a first sensor electrode and a second sensor electrode, wherein the first sensor electrode is configured to drive a first modulated signal, and wherein the second sensor electrode configured to drive a second modulated signal; and receiver circuitry coupled to the first sensor electrode and the second sensor electrode, the receiver circuitry being configured to receive a first resulting signal from the first sensor electrode and a second resulting signal from the second sensor electrode, wherein the receiver circuitry is further configured to generate a combination signal based at least in part on the first resulting signal and the second resulting signal, wherein the input device is configured to determine, using the first sensor electrode, a change in an absolute capacitive coupling between the first sensor electrode and an input object in a sensing region of the input device, wherein the input device is further configured to determine, using the first sensor electrode and the second sensor electrode, a change in a transcapacitive coupling between the first sensor electrode and the second sensor electrode, wherein the input device is further configured to determine whether a ratio of the change in the absolute capacitive coupling to the change in the transcapacitive coupling exceeds a first predetermined threshold, wherein the input device is further configured to determine whether the input device is disposed in a predetermined low ground mass state, wherein the input device is further configured to determine, using the combination signal, when the input device is not disposed in the predetermined low ground mass state, and when the ratio fails to exceed the first predetermined threshold, first positional information regarding a location of the input object in the sensing region, and wherein the input device is further configured to determine, when the ratio fails to exceed the first predetermined threshold and when the input device is disposed in the predetermined low ground mass state, second positional information regarding the location of the input object in the sensing region using an absolute capacitive scan of the sensing region.

13. The electronic system of claim 12, wherein the plurality of sensor electrodes comprises a grid electrode array, the grid electrode array comprising a first subset of sensor electrodes perpendicular to a second subset of sensor electrodes, wherein the first subset of sensor electrodes comprises at least one absolute capacitive receiver electrode, wherein the second subset of sensor electrodes comprises a plurality of overguarded transmitter electrodes, wherein the sensor module is further configured to generate a second combination signal that comprises effects of an absolute capacitive coupling between the at least one absolute capacitive receiver electrode and one or more input objects, and wherein the second combination signal further comprises effects of transcapacitance between the plurality of overguarded transmitter electrodes.

14. The electronic system of claim 12, wherein the input device is further configured to generate a baseline combination signal when no input object is located in the sensing region, and wherein the determination module is further configured to compare first combination signal to the baseline combination signal to determine the first positional information.

15. The electronic system of claim 12, further comprising:

transmitter circuitry coupled to the first sensor electrode and the second sensor electrode, wherein the transmitter circuitry is configured to drive the first modulated signal along the first sensor electrode and drive the second modulated signal along the second sensor electrode.

16. The electronic system of claim 12, wherein the display device is an organic light emitting diode (OLED) display device.

17. A method of capacitive sensing, comprising:

driving a first modulated signal onto a first sensor electrode in an input device and a second modulated signal onto a second sensor electrode in the input device;

receiving, simultaneously, a first resulting signal from the first sensor electrode and a second resulting signal from the second sensor electrode;

determining, using the first sensor electrode, a change in an absolute capacitive coupling between the first sensor electrode and an input object in a sensing region of the input device;

determining, using the first sensor electrode and the second sensor electrode, a change in a transcapacitive coupling between the first sensor electrode and the second sensor electrode;

determining whether a ratio of the change in the absolute capacitive coupling to the change in the transcapacitive exceeds a first predetermined threshold;

determining whether the input device is disposed in a predetermined low ground mass state;

generating, based at least in part on the first resulting signal and the second resulting signal, a combination signal;

determining, using the combination signal, when the input device is not disposed in the predetermined low ground mass state, and when the ratio fails to exceed the first predetermined threshold, first positional information regarding a location of the input object in the sensing region; and determining, when the ratio fails to exceed the first predetermined threshold and when the input device is disposed in the predetermined low ground mass state, second positional information regarding the location of the input object in the sensing region using an absolute capacitive scan of the sensing region.

18. The method of claim 17, further comprising:

determining whether the ratio of the change in the absolute capacitive coupling to the change in the transcapacitive coupling fails to exceed a second predetermined threshold, wherein the second predetermined threshold is lower than the first predetermined threshold; and determining, using the first combination signal, when the ratio fails to exceed the second predetermined threshold, regardless of whether the input device is disposed in the predetermined low ground mass state, third positional information regarding the location of the input object in the sensing region.

19. The method of claim 17, further comprising:

generating a second combination signal that comprises effects of an absolute capacitive coupling between at least one absolute capacitive receiver electrode and one or more input objects, wherein the second combination signal further comprises effects of transcapacitance between a plurality of overguarded transmitter electrodes.

20. The method of claim 17, further comprising:

generating a baseline combination signal when no input object is located in the sensing region; and comparing the first combination signal to the baseline combination signal to determine the first positional information.

* * * * *

UNITED STATES PATENT AND TRADEMARK OFFICE
CERTIFICATE OF CORRECTION

Page 1 of 1

PATENT NO. : 11,093,093 B2
APPLICATION NO. : 16/834976
DATED : August 17, 2021
INVENTOR(S) : John Weinerth et al.

It is certified that error appears in the above-identified patent and that said Letters Patent is hereby corrected as shown below:

In the Claims

At Column 52, Claim 12, Line 34, the words "wherein the second sensor electrode configured to" should read -- wherein the second sensor electrode is configured to --.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*